(12) United States Patent
Jeong et al.

(10) Patent No.: US 12,114,555 B2
(45) Date of Patent: Oct. 8, 2024

(54) DISPLAY APPARATUS AND METHOD OF MANUFACTURING THE SAME

(71) Applicant: Samsung Display Co., Ltd., Yongin-si (KR)

(72) Inventors: Seungyeon Jeong, Yongin-si (KR); Ohjeong Kwon, Yongin-si (KR); Hongyeon Lee, Yongin-si (KR); Minju Han, Yongin-si (KR); Hyeoji Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 405 days.

(21) Appl. No.: 17/548,018

(22) Filed: Dec. 10, 2021

(65) Prior Publication Data
US 2022/0238606 A1  Jul. 28, 2022

(30) Foreign Application Priority Data
Jan. 28, 2021 (KR) ........................ 10-2021-0012651

(51) Int. Cl.
*H01L 27/32* (2006.01)
*H10K 50/856* (2023.01)
*H10K 50/86* (2023.01)
*H10K 59/12* (2023.01)
(Continued)

(52) U.S. Cl.
CPC ........... *H10K 59/38* (2023.02); *H10K 50/856* (2023.02); *H10K 50/865* (2023.02); *H10K 59/12* (2023.02); *H10K 71/00* (2023.02); *H10K 59/1201* (2023.02)

(58) Field of Classification Search
CPC .... H10K 59/38; H10K 50/856; H10K 50/865; H10K 59/12; H10K 71/00; H10K 59/1201; H10K 2102/331; H10K 50/858; G02B 6/0026; G02B 6/0031; G02B 6/0068
See application file for complete search history.

(56) References Cited

U.S. PATENT DOCUMENTS

| 6,887,631 B2 | 5/2005 | Kiguchi et al. |
| 9,680,054 B2 | 6/2017 | Coe-Sullivan et al. |
| 9,698,311 B2 | 7/2017 | Greco et al. |

(Continued)

FOREIGN PATENT DOCUMENTS

| KR | 10-2017-0122343 A | 11/2017 |
| KR | 10-2019-0111177 A | 10/2019 |

*Primary Examiner* — Mohammed R Alam
(74) *Attorney, Agent, or Firm* — Lewis Roca Rothgerber Christie LLP

(57) ABSTRACT

A display apparatus includes: a first light-emitting device, a second light-emitting device, and a third light-emitting device, on a substrate; a first color conversion layer and a second color conversion layer respectively on the first light-emitting device and the second light-emitting device; a transmissive layer on the third light-emitting device; and an optical functional layer on the first color conversion layer, the second color conversion layer, and the transmissive layer, and comprising a reflective metal layer and a light-absorbing layer, the light-absorbing layer being on the reflective metal layer, wherein the optical functional layer comprises a plurality of openings respectively corresponding to a first emission area of the first light-emitting device, a second emission area of the second light-emitting device, and a third emission area of the third light-emitting device.

23 Claims, 21 Drawing Sheets

(51) Int. Cl.
    *H10K 59/38*     (2023.01)
    *H10K 71/00*     (2023.01)

(56) References Cited

U.S. PATENT DOCUMENTS

| | | |
|---|---|---|
| 9,761,641 B2 | 9/2017 | Liu |
| 10,379,395 B2 | 8/2019 | Lee et al. |
| 2019/0293990 A1 | 9/2019 | Kwon et al. |
| 2021/0202585 A1* | 7/2021 | Chen .................. H10K 59/38 |
| 2023/0096606 A1* | 3/2023 | Yang .................. H10K 59/8791 |
| | | 257/40 |

* cited by examiner

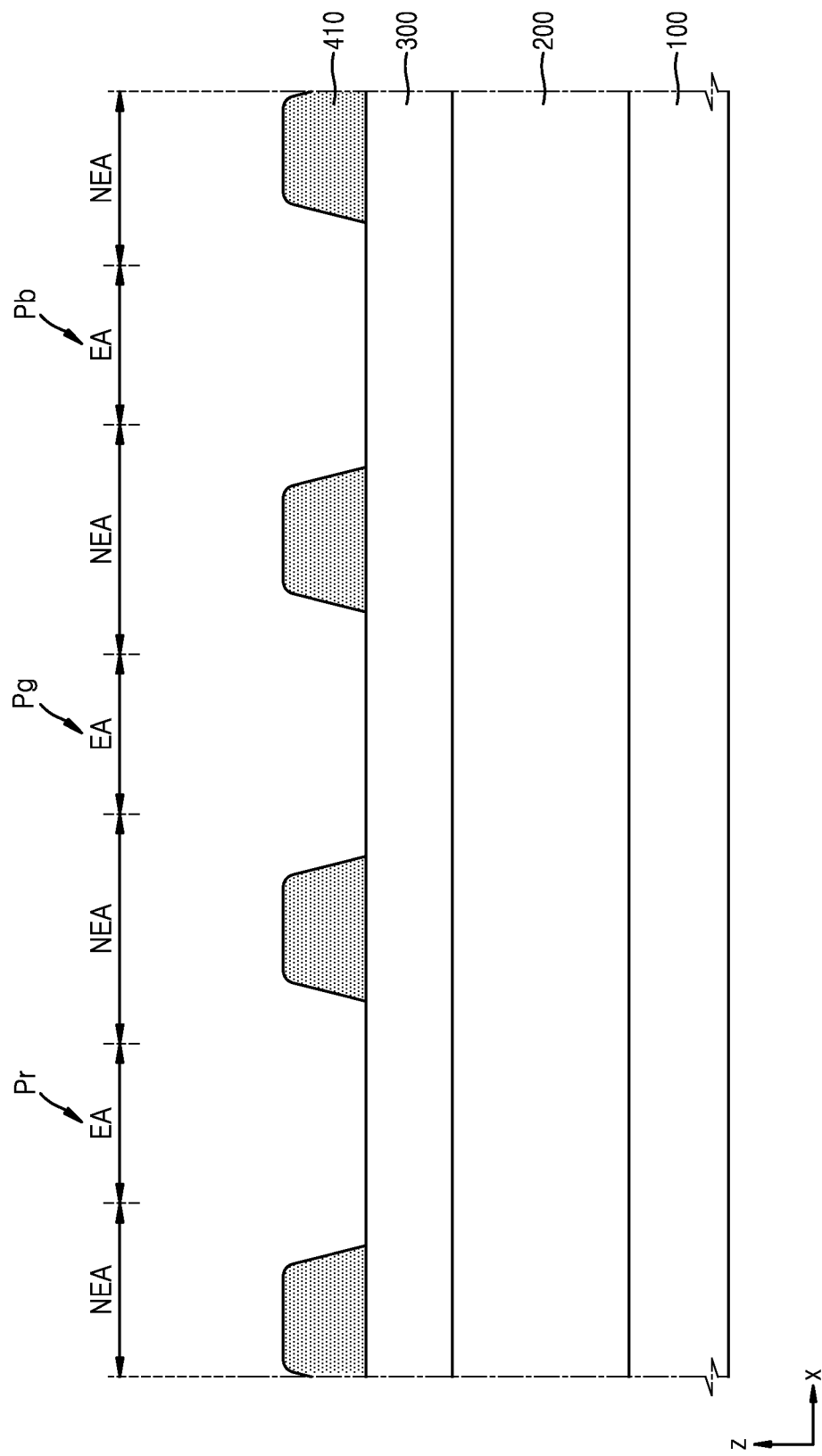

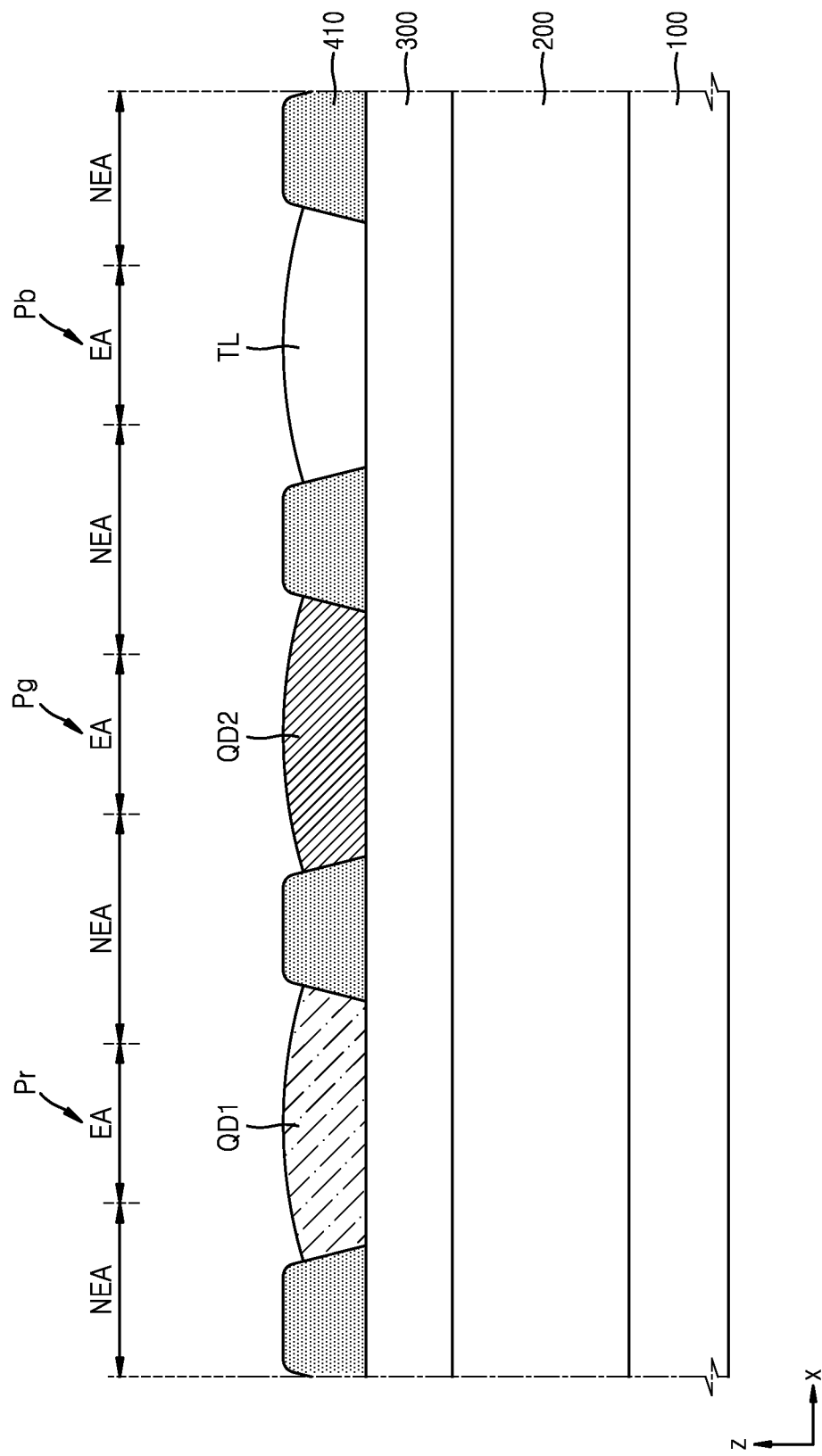

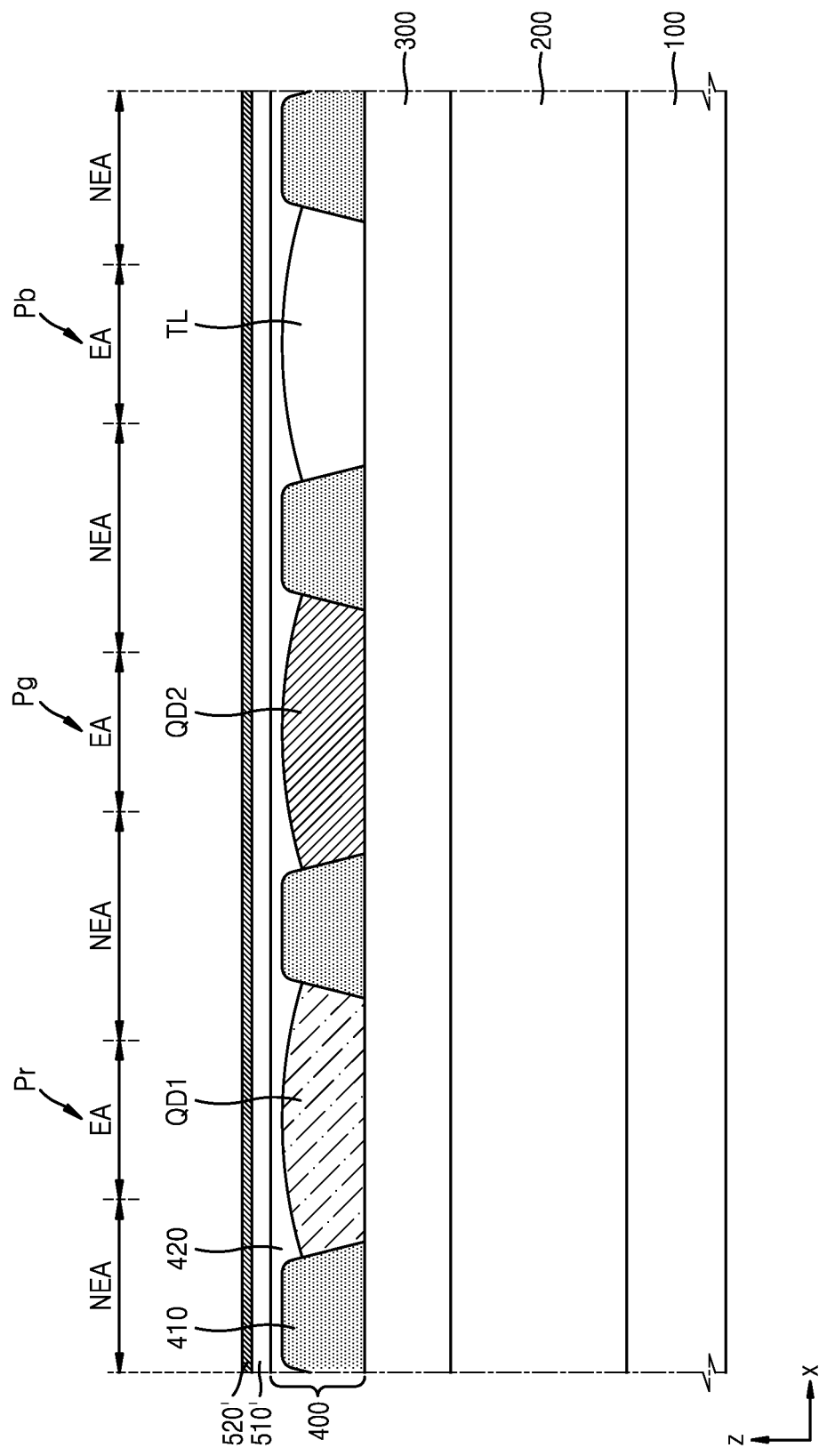

DISPLAY APPARATUS AND METHOD OF MANUFACTURING THE SAME

CROSS-REFERENCE TO RELATED APPLICATION

The present application claims priority to and the benefit of Korean Patent Application No. 10-2021-0012651, filed on Jan. 28, 2021, in the Korean Intellectual Property Office, the entire disclosure of which is incorporated herein by reference.

BACKGROUND

1. Field

Aspects of one or more embodiments relate to a display apparatus and a method of manufacturing the same.

2. Description of the Related Art

Organic light-emitting display apparatuses among display apparatuses are noted as next-generation display apparatuses due to their relatively wide viewing angles, relatively high contrast, and relatively fast response times.

In general, in an organic light-emitting display apparatus, a thin-film transistor and organic light-emitting devices are formed on a substrate, and the organic light-emitting devices may emit light by themselves (e.g., without use of a backlight). Such an organic light-emitting display apparatus may be used as a display for a small product or electronic device such as a mobile phone, or may be used as a display for a large product or electronic device such as a television.

The above information disclosed in this Background section is only for enhancement of understanding of the background and therefore the information discussed in this Background section does not necessarily constitute prior art.

SUMMARY

Aspects of one or more embodiments relate to a display apparatus and a method of manufacturing the same, and for example, to a display apparatus with relatively minimized or reduced reflection of external light and relatively improved light efficiency, and a method of manufacturing the display apparatus.

However, a display apparatus and a method of manufacturing the same may have problems in that light efficiency may be reduced when a structure for blocking reflection of external light is applied, or a manufacturing processing may be complicated due to an increase in the number of masks.

One or more embodiments include a display apparatus with relatively minimized or reduced reflection of external light and relatively improved light efficiency and a method of manufacturing the display apparatus. However, the embodiments are examples, and do not limit the scope of embodiments according to the disclosure.

Additional aspects will be set forth in part in the description which follows and, in part, will be apparent from the description, or may be learned by practice of the presented embodiments.

According to one or more embodiments, a display apparatus includes a first light-emitting device, a second light-emitting device, and a third light-emitting device located on a substrate, a first color conversion layer and a second color conversion layer respectively located on the first light-emitting device and the second light-emitting device, a transmissive layer located on the third light-emitting device, and an optical functional layer located on the first color conversion layer, the second color conversion layer, and the transmissive layer, and including a reflective metal layer and a light-absorbing layer, the light-absorbing layer being located on the reflective metal layer, wherein the optical functional layer includes a plurality of openings respectively corresponding to a first emission area of the first light-emitting device, a second emission area of the second light-emitting device, and a third emission area of the third light-emitting device.

According to some embodiments, the plurality of openings may be formed as slits.

According to some embodiments, a reflectance of the reflective metal layer may be equal to or greater than 85%.

According to some embodiments, the reflective metal layer may include a super aluminum (s-Al) metal.

According to some embodiments, the light-absorbing layer may include a metal having an absorption coefficient.

According to some embodiments, the light-absorbing layer may include at least one of molybdenum (Mo), tantalum (Ta), manganese (Mn), or magnesium (Mg).

According to some embodiments, the light-absorbing layer may include molybdenum tantalum oxide (MoTaOx, MTO).

According to some embodiments, the light-absorbing layer may include an organic black matrix.

According to some embodiments, the reflective metal layer may have a thickness ranging from about 1000 Å to about 3000 Å.

According to some embodiments, the light-absorbing layer may have a thickness ranging from about 400 Å to about 1000 Å.

According to some embodiments, the optical functional layer may further include a phase assistant layer located on the reflective metal layer.

According to some embodiments, the phase assistant layer may be located between the reflective metal layer and the light-absorbing layer, or on the light-absorbing layer.

According to some embodiments, the phase assistant layer may include a light-transmitting metal.

According to some embodiments, the phase assistant layer may have a thickness ranging from about 50 Å to about 100 Å.

According to some embodiments, the plurality of openings may include first openings located in the first emission area, second openings located in the second emission area, and third openings located in the third emission area, wherein the first openings, the second openings, and the third openings have different aperture ratios.

According to some embodiments, widths of the first openings, the second openings, and the third openings may be different from one another.

According to some embodiments, the first color conversion layer may include first quantum dots, and the second color conversion layer may include second quantum dots.

According to some embodiments, the display apparatus may further include a filter layer located on the optical functional layer, to correspond to the first color conversion layer and the second color conversion layer.

According to some embodiments, the filter layer may include a yellow organic material.

According to some embodiments, each of the first light-emitting device, the second light-emitting device, and the third light-emitting device may be an organic light-emitting diode that emits blue light.

According to one or more embodiments, a method of manufacturing a display apparatus includes forming, on a substrate, a first light-emitting device, a second light-emitting device, and a third light-emitting device, forming a first color conversion layer, a second color conversion layer, and a transmissive layer respectively on the first light-emitting device, the second light-emitting device, and the third light-emitting device, forming a reflective metal material layer on the first color conversion layer, the second color conversion layer, and the transmissive layer, forming a light-absorbing material layer on the reflective metal material layer, forming a light-absorbing layer by patterning the light-absorbing material layer to have a plurality of openings respectively corresponding to the first light-emitting device, the second light-emitting device, and the third light-emitting device, and forming a reflective metal layer by patterning the reflective metal material layer by using the light-absorbing layer as a mask pattern.

According to some embodiments, the light-absorbing layer may include an organic black matrix.

According to some embodiments, aperture ratios of the plurality of openings respectively corresponding to the first light-emitting device, the second light-emitting device, and the third light-emitting device may be different from one another.

Other features and characteristics of some embodiments of the disclosure will become more apparent from the drawings, the claims, and the detailed description.

These general and specific embodiments may be implemented by using a system, a method, a computer program, or a combination thereof.

BRIEF DESCRIPTION OF THE DRAWINGS

The above and other aspects, features, and characteristics of certain embodiments will be more apparent from the following description taken in conjunction with the accompanying drawings, in which:

FIGS. 15A through 15E are cross-sectional views illustrating a method of manufacturing a display apparatus, according to some embodiments.

DETAILED DESCRIPTION

Figure 1A:
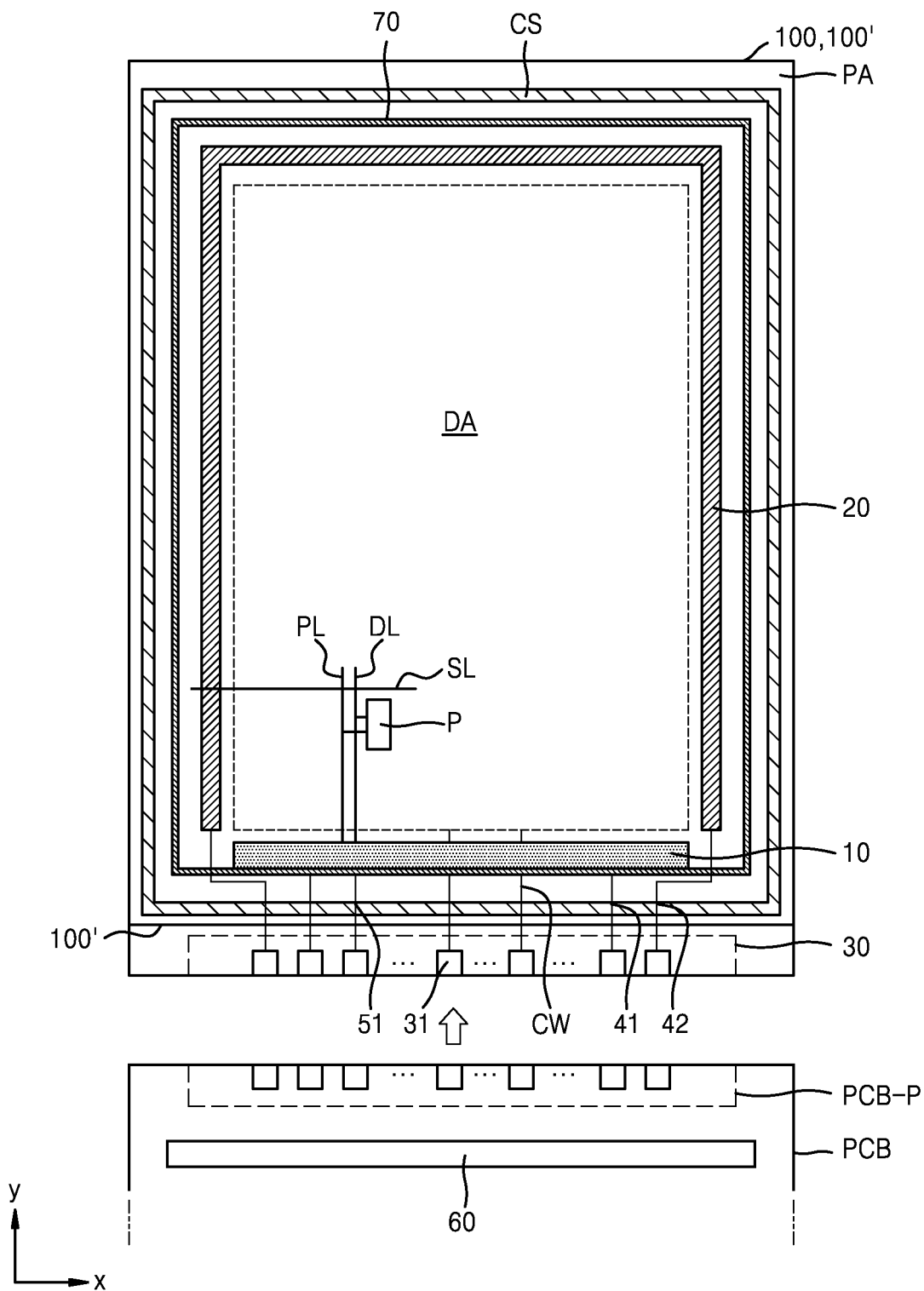
FIGS. 1A and 1B are plan views illustrating examples of a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

"A and/or B" is used herein to select only A, select only B, or select both A and B. "At least one of A and B" is used to select only A, select only B, or select both A and B.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or may be performed in an order opposite to the described order.

Sizes of elements in the drawings may be exaggerated or contracted for convenience of description. For example, because sizes and thicknesses of elements in the drawings are arbitrarily illustrated for convenience of description, the disclosure is not limited thereto.

Hereinafter, although an organic light-emitting display apparatus is described as a display apparatus 1 according to some embodiments, the display apparatus 1 of the present disclosure is not limited thereto. According to some embodiments, the display apparatus 1 may be an inorganic light-emitting display apparatus, an inorganic electroluminescent (EL) display apparatus, or a quantum dot light-emitting display apparatus. For example, an emission layer of a display element, that is, a light-emitting device, included in the display apparatus 1 may include an organic material, an inorganic material, quantum dots, an organic material and quantum dots, or an inorganic material and quantum dots.

Figure 1B:
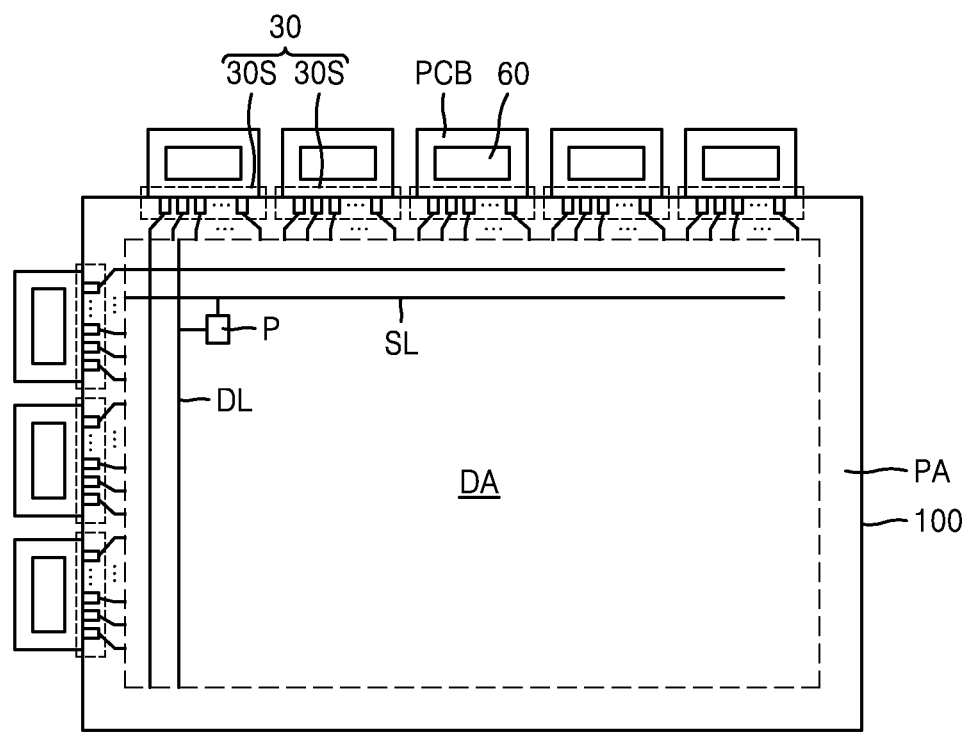

FIGS. 1A and 1B are plan views illustrating examples of a display apparatus, according to some embodiments.

Referring to FIG. 1A, the display apparatus includes a display area DA and a peripheral area PA located around (e.g., outside a footprint of) the display area DA. The display apparatus may display images by using light emitted by a plurality of pixels P located in the display area DA (a single pixel P is illustrated for convenience of illustration, but a person having ordinary skill in the art would understand that the display area DA may include a plurality of pixels P). The term 'pixel P' used herein may substantially refer to a sub-pixel including one organic light-emitting diode.

The display area DA includes the pixels P connected to a data line DL extending in an x-direction and a scan line SL extending in a y-direction that intersects the x-direction. Each of the pixels P is also connected to a driving voltage line PL extending in the x-direction.

Each of the pixels P may include a light-emitting device such as an organic light-emitting diode OLED. Each pixel P may emit light, for example, red light, green light, blue light, or white light, through the organic light-emitting diode OLED.

According to some embodiments, a color of each pixel P may be exhibited by a first color conversion layer QD1 or a second color conversion layer QD2 (see FIG. 3) located over the organic light-emitting diode OLED, separate from a color of light emitted by the organic light-emitting diode OLED included in each pixel P.

Each pixel P may be electrically connected to internal circuits located in the peripheral area PA. A first power supply wiring 10, a second power supply wiring 20, and a pad unit 30 may be located in the peripheral area PA.

The first power supply wiring 10 may be located to correspond to a side of the display area DA. The first power supply wiring 10 may be connected to a plurality of driving voltage lines PL through which a driving voltage ELVDD (see FIGS. 2A and 2B) is transmitted to the pixel P.

The second power supply wiring 20 has a loop shape with an open side and may partially surround the display area DA. The second power supply wiring 20 may supply a common voltage ELVSS (see FIGS. 2A and 2B) to a counter electrode of the pixel P. The second power supply wiring 20 may be referred to as a common voltage supply wiring.

The pad unit 30 may include a plurality of pads 31, and may be located on a side or edge of a substrate 100. Each of the pads 31 may be connected to a first connection wiring 41 connected to the first power supply wiring 10, a second connection wiring 42 connected to the second power supply wiring 20, or a connection wiring CW extending to the display area DA. The pads 31 of the pad unit 30 may be exposed without being covered by an insulating layer, and may be electrically connected to a printed circuit board PCB. A terminal portion PCB-P of the printed circuit board PCB may be electrically connected to the pad unit 30.

The printed circuit board PCB transmits a signal or power of a controller to the pad unit 30. The controller may supply the driving voltage ELVDD and the common voltage ELVSS (see FIGS. 2A and 2B) respectively to the first and second power supply wirings 10 and 20 through first and second connection wirings 41 and 42.

A data driving circuit 60 is electrically connected to the data line DL. A data signal of the data driving circuit 60 may be applied to each pixel P through the connection wiring CW connected to the pad unit 30 and the data line DL connected to the connection wiring CW. Although the data driving circuit 60 is located on the printed circuit board PCB in FIG. 1A, according to some embodiments, the data driving circuit 60 may be located on the substrate 100. For example, the data driving circuit 60 may be located between the pad unit 30 and the first power supply wiring 10.

A dam portion 70 may be located in the peripheral area PA. The dam portion 70 may prevent or reduce instances of an organic material flowing toward an edge of the substrate 100 when an organic encapsulation layer 320 (see FIG. 5) of a thin-film encapsulation layer 300 (see FIG. 5) is formed, thereby preventing or reducing instances of an edge tail of the organic encapsulation layer 320 being formed. The dam portion 70 may be located in the peripheral area PA to surround at least a part of the display area DA. The dam portion 70 may include a plurality of dams, and when the plurality of dams are provided, the dams may be spaced apart from one another. The dam portion 70 may be located in the peripheral area PA to be closer to the display area DA than a sealing member CS. An internal driving circuit for applying a scan signal of each pixel may be further provided in the peripheral area PA. In some embodiments, the internal driving circuit unit and the dam portion 70 may overlap each other.

The display apparatus may be formed by bonding the substrate 100 and an upper substrate 100' to each other by using the sealing member CS. The sealing member CS may be formed along the peripheral area PA of the substrate 100 to surround the display area DA, to bond the substrate 100 and the upper substrate 100' to each other. According to some embodiments, when the display apparatus is flexible, the upper substrate 100' and the sealing member CS may be omitted.

Although one printed circuit board PCB is attached to the pad unit 30 in FIG. 1A, a plurality of printed circuit boards PCB may be attached to the pad unit 30 as shown in FIG. 1B. Also, the pad unit 30 may be located along two sides of the substrate 100. The pad unit 30 may include a plurality of sub-pad units 30s, and one printed circuit board PCB may be attached to each sub-pad unit 30s.

Figure 2A:
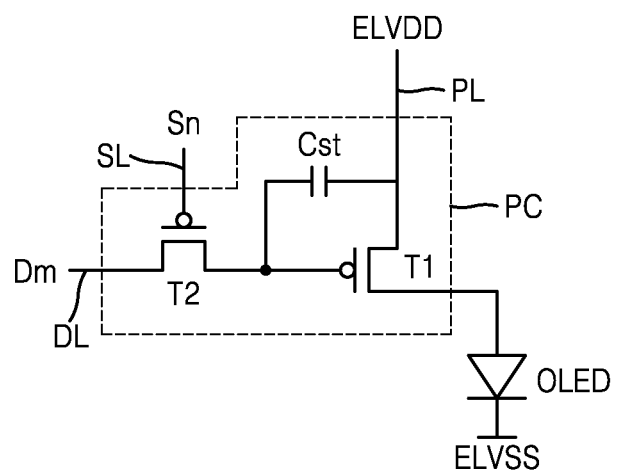
FIGS. 2A and 2B are equivalent circuit diagrams illustrating a pixel that may be included in a display apparatus, according to some embodiments.
Figure 2B:
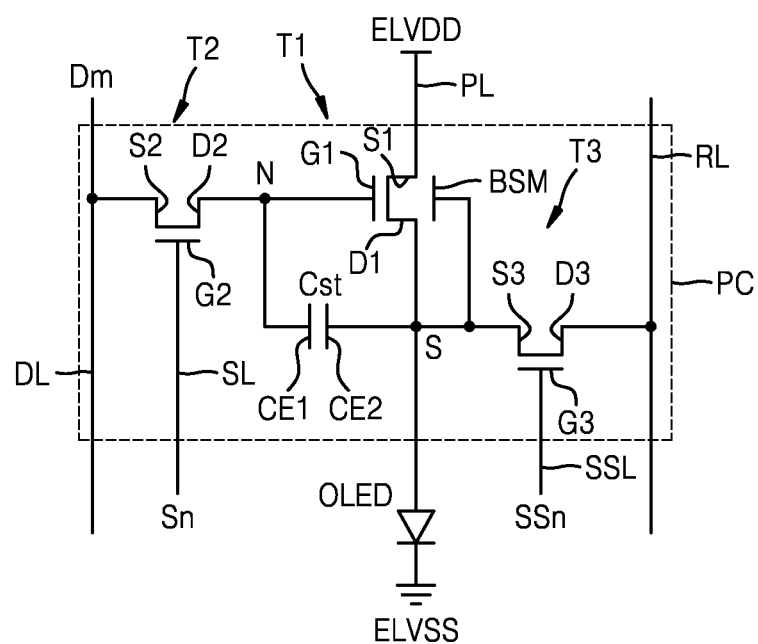

FIGS. 2A and 2B are equivalent circuit diagrams illustrating a pixel that may be included in a display apparatus, according to some embodiments.

Referring to FIG. 2A, each pixel P may include a pixel circuit PC connected to the scan line SL and the data line DL, and an organic light-emitting diode OLED connected to the pixel circuit PC. The pixel circuit PC may include a driving thin-film transistor T1, a switching thin-film transistor T2, and a storage capacitor Cst. The switching thin-film transistor T2 may be connected to the scan line SL and the data line DL, and may transmit a data signal Dm input through the data line DL to the driving thin-film transistor T1 according to a scan signal Sn input through the scan line SL.

The storage capacitor Cst may be connected to the switching thin-film transistor T2 and the driving voltage line PL, and may store a voltage corresponding to a difference between a voltage received from the switching thin-film transistor T2 and a first power supply voltage ELVDD (or a driving voltage) supplied to the driving voltage line PL.

The driving thin-film transistor T1 may be connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a certain luminance due to the driving current.

Although the pixel circuit PC includes two thin-film transistors and one storage capacitor in FIG. 2A, embodiments according to the present disclosure are not limited thereto. For example, the pixel circuit PC may include additional transistors or other electrical components, or fewer electrical components, without departing from the spirit and scope of embodiments according to the present disclosure.

Referring to FIG. 2B, the pixel circuit PC may include the driving thin-film transistor T1, the switching thin-film transistor T2, a sensing thin-film transistor T3, and the storage capacitor Cst.

The scan line SL may be connected to a gate electrode G2 of the switching thin-film transistor T2, the data line DL may be connected to a source electrode S2, and a first electrode CE1 of the storage capacitor Cst may be connected to a drain electrode D2.

Accordingly, the switching thin-film transistor T2 may supply a data voltage of the data line DL to a first node N in response to the scan signal Sn from the scan line SL of each pixel P.

A gate electrode G1 of the driving thin-film transistor T1 may be connected to the first node N, a source electrode S1 may be connected to the driving voltage line PL for transmitting the driving voltage ELVDD, and the drain electrode D1 may be connected to an anode of the organic light-emitting diode OLED.

Accordingly, the driving thin-film transistor T1 may adjust the amount of current flowing through the organic light-emitting diode OLED according to its source-gate voltage Vgs, that is, a voltage applied between the driving voltage ELVDD and the first node N.

A sensing control line SSL may be connected to a gate electrode G3 of the sensing thin-film transistor T3, a source electrode S3 may be connected to a second node S, and a drain electrode D3 may be connected to a reference voltage line RL. According to some embodiments, the sensing thin-film transistor T3 may be controlled by the scan line SL, instead of the sensing control line SSL.

The sensing thin-film transistor T3 may sense a potential of a pixel electrode (e.g., anode) of the organic light-emitting diode OLED. The sensing thin-film transistor T3 may supply a pre-charging voltage from the reference voltage line RL to the second node S in response to a sensing signal SSn from the sensing control line SSL, or may supply a voltage of the pixel electrode (e.g., anode) of the organic light-emitting diode OLED to the reference voltage line RL during a sensing period.

The storage capacitor Cst may include the first electrode CE1 connected to the first node N, and a second electrode CE2 connected to the second node S. The storage capacitor Cst may be charged with a difference voltage between voltages supplied to the first and second nodes N and S and may supply the difference voltage as a driving voltage of the driving thin-film transistor T1. For example, the storage capacitor Cst may be charged with a difference voltage between the data voltage Dm and a precharging voltage Vpre respectively supplied to the first and second nodes N and S.

A bias electrode BSM may be formed to correspond to the driving thin-film transistor T1 and may be connected to the source electrode S3 of the sensing thin-film transistor T3. Because the bias electrode BSM receives a voltage in connection with a potential of the source electrode S3 of the sensing thin-film transistor T3, the driving thin-film transistor T1 may be stabilized. According to some embodiments, the bias electrode BSM may not be connected to the source electrode S3 of the sensing thin-film transistor T3, and may be connected to a separate bias wiring.

A counter electrode (e.g., a cathode) of the organic light-emitting diode OLED may receive the common voltage ELVSS. The organic light-emitting diode OLED may receive driving current from the driving thin-film transistor T1 and may emit light.

Although each pixel P includes the signal lines SL, SSL, and DL, the reference voltage line RL, and the driving voltage line PL in FIG. 2B, the disclosure is not limited thereto. For example, at least one of the signal lines SL, SSL, or DL, and/or the reference voltage line RL, or the driving voltage line PL may be shared by neighboring pixels.

The pixel circuit PC is not limited to the number of thin-film transistors and storage capacitors and a circuit design described with reference to FIGS. 2A and 2B and the number and the circuit design may be modified in various ways.

Figure 3:
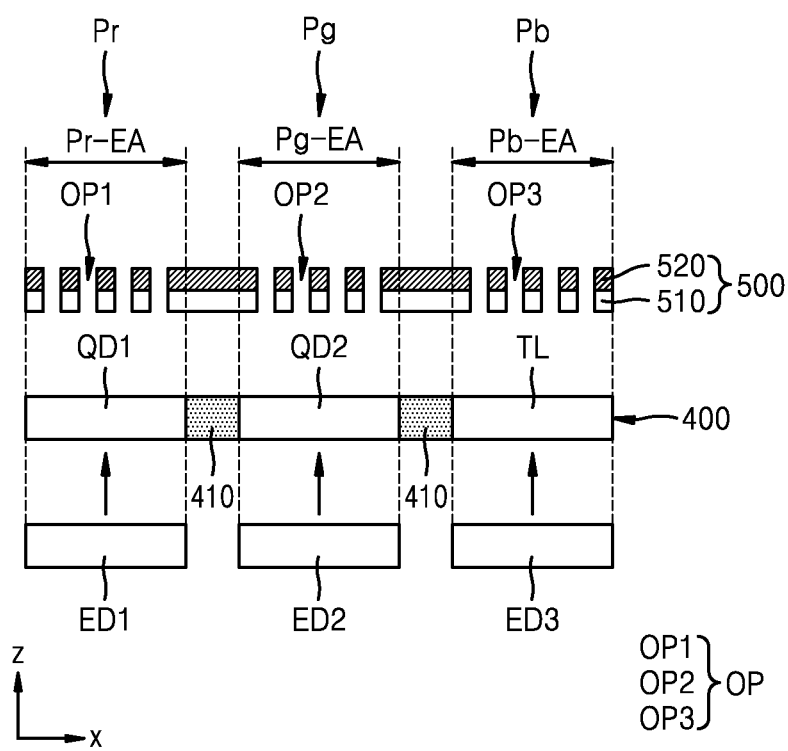
FIG. 3 is a cross-sectional view illustrating a display apparatus according to some embodiments.
Figure 4:
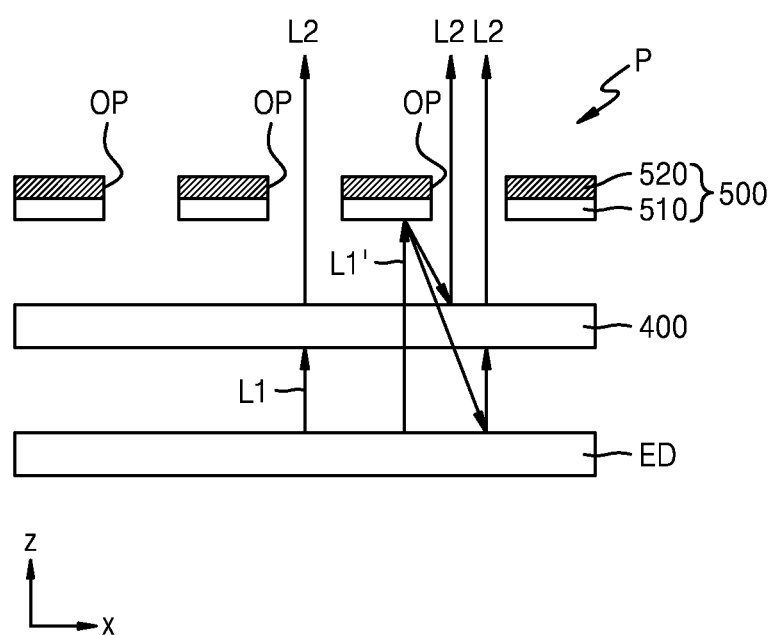
FIG. 4 is a view illustrating an optical path of a pixel, according to some embodiments.

FIG. 3 is a cross-sectional view illustrating a display apparatus according to some embodiments. FIG. 4 is a view illustrating an optical path of a pixel, according to some embodiments.

Referring to FIG. 3, a first pixel Pr, a second pixel Pg, and a third pixel Pb may respectively include a first light-emitting device ED1, a second light-emitting device ED2, and a third light-emitting device ED3. The first light-emitting device ED1, the second light-emitting device ED2, and the third light-emitting device ED3 may be spaced apart from one another. The first light-emitting device ED1, the second light-emitting device ED2, and the third light-emitting device ED3 may function as light sources by emitting light by themselves. The first light-emitting device ED1, the second light-emitting device ED2, and the third light-emitting device ED3 may be, for example, organic light-emitting diodes OLED. However, embodiments according to the disclosure are not limited thereto, as long as the first light-emitting device ED1, the second light-emitting device ED2, and the third light-emitting device ED3 may function as light sources. According to some embodiments, the first light-emitting device ED1, the second light-emitting device ED2, and the third light-emitting device ED3 may be inorganic light-emitting devices, or quantum dot light-emitting devices.

According to some embodiments, the first light-emitting device ED1, the second light-emitting device ED2, and the third light-emitting device ED3 may emit red light, green light, blue light, or white light, and may emit light of the same wavelength or may emit light of different wavelengths. For example, all of the first light-emitting device ED1, the second light-emitting device ED2, and the third light-emitting device ED3 may emit blue light.

A wavelength adjusting layer 400 may be located over the first light-emitting device ED1, the second light-emitting device ED2, and the third light-emitting device ED3. The wavelength adjusting layer 400 may include the first color conversion layer QD1 corresponding to the first light-emitting device ED1, the second color conversion layer QD2 corresponding to the second light-emitting device ED2, and a transmissive layer TL corresponding to the third light-emitting device ED3.

Each of the first color conversion layer QD1 and the second color conversion layer QD2 may include quantum dots. A wavelength of light passing through the first color conversion layer QD1 and the second color conversion layer QD2 may be changed by the quantum dots. The transmissive layer TL may not include quantum dots, and thus light passing through the transmissive layer TL may be emitted to the outside without changing a wavelength.

A partition wall 410 may be located between the first color conversion layer QD1, the second color conversion layer QD2, and the transmissive layer TL. The partition wall 410 may include a light-blocking material when necessary.

An optical functional layer 500 may be located over the wavelength adjusting layer 400. The optical functional layer 500 may include a reflective metal layer 510 and a light-absorbing layer 520 located on the reflective metal layer 510.

The optical functional layer 500 may have a plurality of openings OP respectively corresponding to a first emission area Pr-EA of the first light-emitting device ED1, a second emission area Pg-EA of the second light-emitting device ED2, and a third emission area Pb-EA of the third light-emitting device ED3. According to some embodiments, the plurality of openings OP may include first openings OP1 corresponding to the first emission area Pr-EA, second openings OP2 corresponding to the second emission area Pg-EA, and third openings OP3 corresponding to the third emission area Pb-EA. Each of the first openings OP1, the second openings OP2, and the third openings OP3 may have a preset aperture ratio for each pixel.

Referring to FIG. 4, an optical path of one pixel P is illustrated. The pixel P may be one of the first pixel Pr, the second pixel Pg, and the third pixel Pb of FIG. 3.

A light-emitting device ED provides first color light L1 to the pixel P. Part of the first color light L1 emitted from the light-emitting device ED may be transmitted through the wavelength adjusting layer 400. Also, part of the first color light L1 emitted from the light-emitting device ED may be converted into another color light, for example, second color light L2, by the wavelength adjusting layer 400. Part of the second color light L2 transmitted through the wavelength adjusting layer 400 may pass through the optical functional layer 500. The optical functional layer 500 may have the plurality of openings OP, and part of the second color light L2 transmitted through the wavelength adjusting layer 400 may pass through the optical functional layer 500 through the plurality of openings OP.

Part of first color light L1' emitted from the light-emitting device ED may pass through the wavelength adjusting layer 400 as it is without changing a wavelength. The part of the first color light L1' passing through the wavelength adjusting layer 400 may be reflected by the optical functional layer 500. Because the optical functional layer 500 includes the reflective metal layer 510 on its bottom surface, the part of the first color light L1' reflected by the reflective metal layer 510 may re-enter the wavelength adjusting layer 400 and/or the light-emitting device ED. The light re-entering the wavelength adjusting layer 400 and/or the light-emitting device ED may be re-reflected and may pass through the optical functional layer 500. Light efficiency of the display apparatus may be improved through light recycling using such internal reflection.

Part of the second color light L2 transmitted through the wavelength adjusting layer 400 may be reflected by the reflective metal layer 510, without passing through the optical functional layer 500. The part of the second color light L2 reflected by the reflective metal layer 510 may re-enter the wavelength adjusting layer 400 and/or the light-emitting device ED. In this case, also, light recycling using internal reflection may occur.

Figure 5:
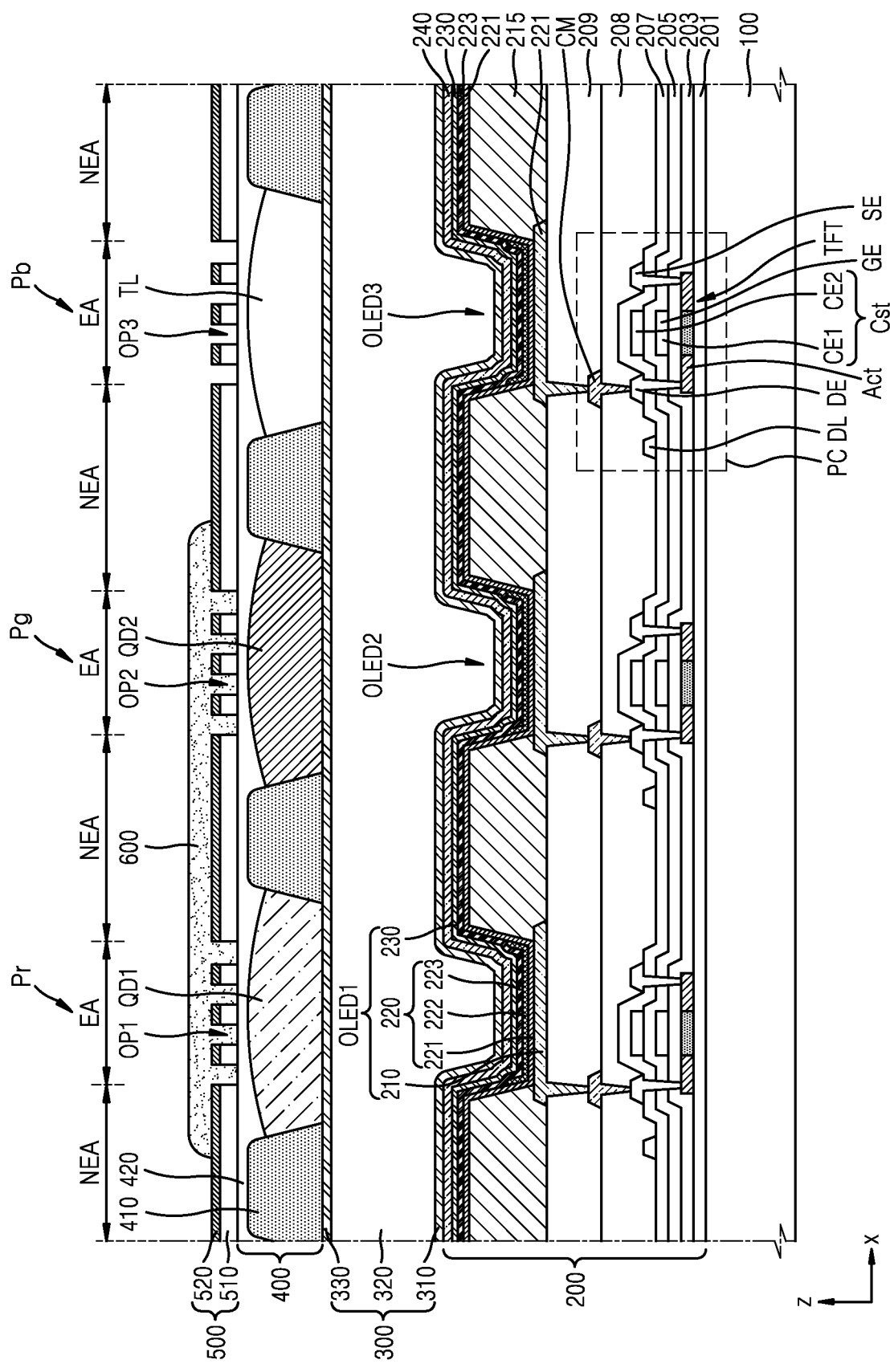
FIGS. 5 and 6 are cross-sectional views illustrating a display apparatus according to some embodiments.
Figure 6:
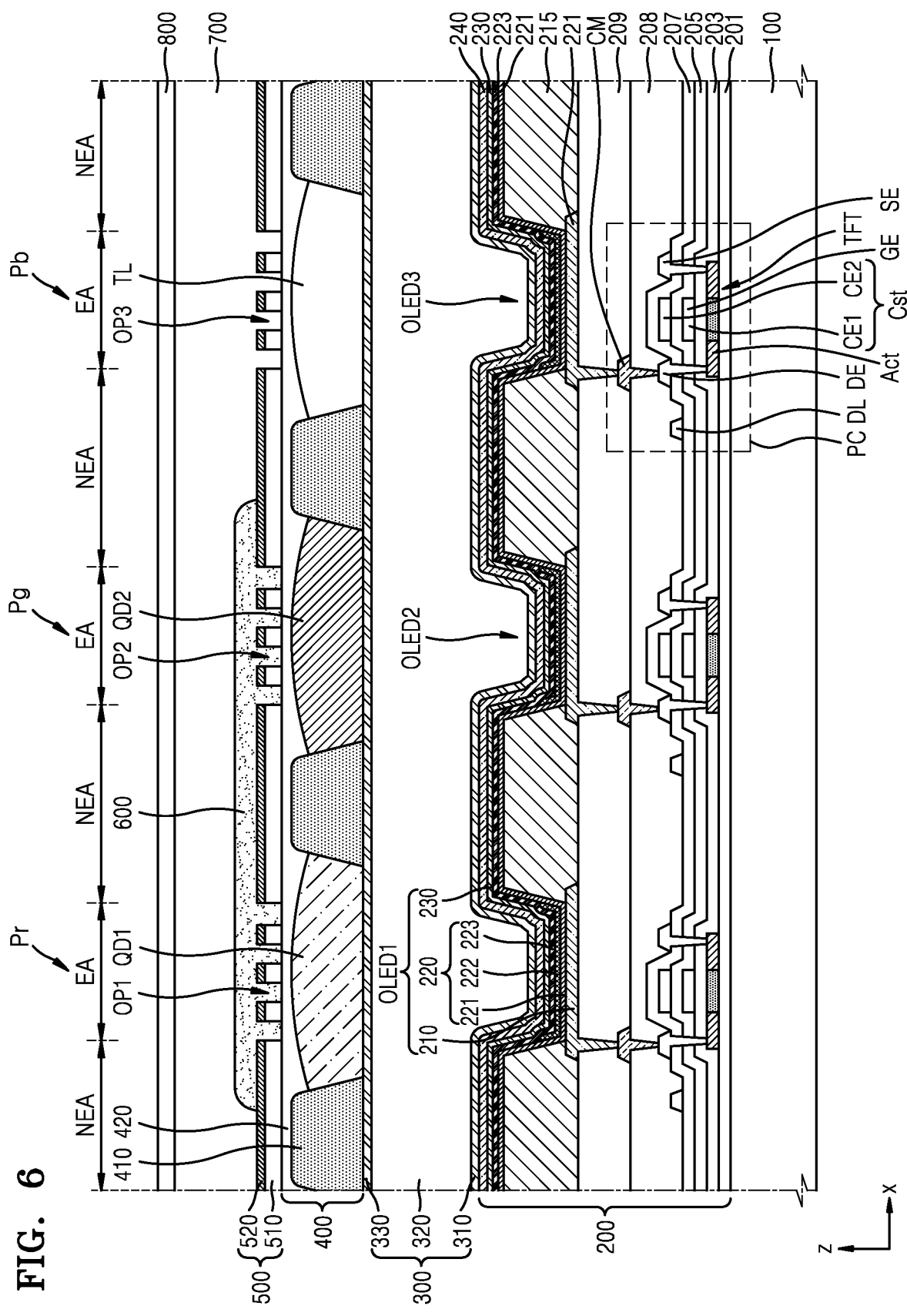

FIGS. 5 and 6 are cross-sectional views illustrating a display apparatus according to some embodiments.

Referring to FIG. 5, the first through third pixels Pr, Pg, and Pb are located on the substrate 100. The first through third pixels Pr, Pg, and Pb may respectively include first through third light-emitting devices and the pixel circuits PC, and the first through third light-emitting devices may be electrically connected to the pixel circuits PC to control light emission. According to some embodiments, the first through third light-emitting devices may be respectively first through third organic light-emitting diodes OLED1, OLED2, and OLED3. Because the pixel circuits PC included in the first through third pixels Pr, Pg, and Pb have the same structure, the following will focus on a stacked structure of one pixel.

First, the substrate 100 may include a glass material or a polymer resin. According to some embodiments, the substrate 100 may include a plurality of sub-layers. The plurality of sub-layers may have a structure in which an organic layer and an inorganic layer are alternately stacked. When the substrate 100 includes a polymer resin, the substrate 100 may include polyethersulfone, polyacrylate, polyetherimide, polyethylene naphthalate, polyethylene terephthalate, polyphenylene sulfide, polyarylate, polyimide, polycarbonate, or cellulose acetate propionate.

A display layer 200 including a light-emitting device and a thin-film encapsulation layer covering the display layer 200 may be located on the substrate 100. Hereinafter, further details of the display layer 200 will be described in more detail.

A buffer layer 201 may be formed on the substrate 100 to prevent or reduce instances of impurities penetrating into a semiconductor layer Act of a thin-film transistor TFT. The buffer layer 201 may include an inorganic insulating material such as silicon nitride, silicon oxynitride, or silicon oxide, and may have a single or multi-layer structure including the above inorganic insulating material.

The pixel circuit PC may be located on the buffer layer 201. The pixel circuit PC may be located to correspond to each pixel P. The pixel circuit PC includes the thin-film transistor TFT and the storage capacitor Cst. The thin-film transistor TFT may include the semiconductor layer Act, a gate electrode GE, a source electrode SE, and a drain electrode DE.

According to some embodiments, the data line DL of the pixel circuit PC is electrically connected to a switching thin-film transistor included in the pixel circuit PC. Although the thin-film transistor TFT is illustrated as being a top gate type transistor in which the gate electrode GE is located on the semiconductor layer Act with a gate insulating layer 203, embodiments are not limited thereto, and according to some embodiments, the thin-film transistor TFT may be a bottom gate type transistor.

The semiconductor layer Act may include polysilicon. Alternatively, the semiconductor layer Act may include amorphous silicon, an oxide semiconductor, or an organic semiconductor.

The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, or hafnium oxide. The gate insulating layer 203 may have a single or multi-layer structure including the above material.

The source electrode SE and the drain electrode DE may be located on the same layer as the data line DL, and may include the same material. The source electrode SE, the drain electrode DE, and the data line DL may include a material having high conductivity. Each of the source electrode SE and the drain electrode DE may include a conductive material including molybdenum (Mo), aluminum (Al), copper (Cu), or titanium (Ti), and may have a single or multi-layer structure including the above material. For example, the source electrode SE, the drain electrode DE, and the data line DL may be formed to have a multi-layer structure including Ti/Al/Ti.

The storage capacitor Cst may include the first electrode CE1 and the second electrode CE2 overlapping each other with a first interlayer insulating layer 205 therebetween. The storage capacitor Cst may overlap the thin-film transistor TFT. In this regard, in FIG. 5, the gate electrode GE of the thin-film transistor TFT is the first electrode CE1 of the storage capacitor Cst. According to some embodiments, the storage capacitor Cst may not overlap the thin-film transistor TFT. The storage capacitor Cst may be covered by a second interlayer insulating layer 207. The second electrode CE2 of the storage capacitor Cst may include a conductive material including molybdenum (Mo), aluminum (Al), copper (Cu), or titanium (Ti), and may have a single or multi-layer structure including the above material.

Each of the first interlayer insulating layer 205 and the second interlayer insulating layer 207 may include an inorganic insulating material such as silicon oxide, silicon nitride, silicon oxynitride, aluminum oxide, titanium oxide, tantalum oxide, or hafnium oxide. Each of the second insulating layer 205 and the third insulating layer 207 may have a single or multi-layer structure including the above material.

The pixel circuit PC including the thin-film transistor TFT and the storage capacitor Cst may be covered by a first planarization insulating layer 208. The first planarization insulating layer 208 may include a substantially flat top surface.

According to some embodiments, a third interlayer insulating layer may be further located under the first planarization insulating layer 208. The third interlayer insulating layer may include an inorganic insulating layer such as silicon oxide, silicon nitride, or silicon oxynitride.

The pixel circuit PC may be electrically connected to a pixel electrode 210. For example, as shown in FIG. 5, a contact metal layer CM may be located between the thin-film transistor TFT and the pixel electrode 210. The contact metal layer CM may be connected to the thin-film transistor TFT through a contact hole formed in the first planarization insulating layer 208, and the pixel electrode 210 may be connected to the contact metal layer CM through a contact hole formed in a second planarization insulating layer 209 on the contact metal layer CM. The contact metal layer CM may include a conductive material including molybdenum (Mo), aluminum (Al), copper (Cu), or titanium (Ti), and may have a single or multi-layer structure including the above material. For example, the contact metal layer CM may have a multi-layer structure including Ti/Al/Ti.

Each of the first planarization insulating layer 208 and the second planarization insulating layer 209 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. According to some embodiments, each of the first planarization insulating layer 208 and the second planarization insulating layer 209 may include polyimide.

The first through third organic light-emitting diodes OLED1, OLED2, and OLED3 may be located on the second planarization insulating layer 209. According to some embodiments, each of the first through third organic light-emitting diodes OLED1, OLED2, and OLED3 may include the pixel electrode 210, a first common layer 221, an emission layer 222, a second common layer 223, and a counter electrode 230. In each of the first through third organic light-emitting diodes OLED1, OLED2, and OLED3, the pixel electrode 210 and the emission layer 222 may be patterned for each pixel, and the first common layer 221, the second common layer 223, and the counter electrode 230 may be integrally provided in a display area. According to some embodiments, when the first through third organic light-emitting diodes OLED1, OLED2, and OLED3 emit light of the same color (e.g., blue light), the emission layer 222 may also be integrally provided in the display area.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the pixel electrode 210 may further include a film formed of ITO, IZO, ZnO, and/or $In_2O_3$ over/under the reflective film.

A pixel-defining film 215 may be formed on the pixel electrode 210. The pixel-defining film 215 may have an opening through which a top surface of the pixel electrode 210 is exposed, and may cover an edge of the pixel electrode 210. The pixel electrode 215 may include an organic insulating material, or an inorganic insulating material such as silicon nitride, silicon oxynitride, or silicon oxide. Alternatively, the pixel-defining film 215 may include an organic insulating material and an inorganic insulating material.

An intermediate layer 220 includes the emission layer 222. Each of a first emission layer 222a and a second emission layer 222b may include a high molecular weight organic material or a low molecular weight organic material for emitting light of a certain color.

Also, the intermediate layer 220 may include the first common layer 221 located between the first emission layer 222a and the pixel electrode 210 and/or the second common layer 223 located between the second emission layer 222b and the counter electrode 230.

The first common layer 221 may have a single or multi-layer structure. For example, when the first common layer 221 is formed of a high molecular weight material, the first common layer 221 may include a hole transport layer (HTL) having a single-layer structure and may be formed of poly-(3,4)-ethylene-dihydroxythiophene (PEDOT) or polyaniline (PANI). When the first common layer 221 is formed of a low molecular weight material, the first common layer 221 may include a hole injection layer (HIL) and a hole transport layer (HTL).

The second common layer 223 is not always provided. For example, according to some embodiments, when each of the first common layer 221, the first emission layer 222a, and the second emission layer 222b is formed of a high molecular weight material, the second common layer 223 is formed. The second common layer 223 may have a single or multi-layer structure. The second common layer 223 may include an electron transport layer (ETL) and/or an electron injection layer (EIL).

The counter electrode 230 may be formed of a conductive material having a low work function. For example, the counter electrode 230 may include a (semi-) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer formed of ITO, IZO, ZnO, or $In_2O_3$ on the (semi-)transparent layer including the above material.

A capping layer 240 may be located on the counter electrode 230. For example, the capping layer 240 may have a single or multi-layer structure including a material selected from among an organic material, an inorganic material, and a mixture thereof. A LiF layer may be located on the capping layer 240 according to some optional embodiments.

Because the first through third organic light-emitting diodes OLED1, OLED2, and OLED3 may be easily damaged by external moisture or oxygen, the first through third organic light-emitting diodes OLED1, OLED2, and OLED3 may be covered and protected by a thin-film encapsulation layer 300. The thin-film encapsulation layer 300 may cover the display area DA and may extend to a non-display area outside the display area DA. The thin-film encapsulation layer 300 includes at least one organic encapsulation layer and at least one inorganic encapsulation layer. For example, the thin-film encapsulation layer 300 may include a first inorganic encapsulation layer 310, an organic encapsulation layer 320, and a second inorganic encapsulation layer 330.

The first inorganic encapsulation layer 310 may cover the counter electrode 230, and may include silicon nitride, silicon oxynitride, or silicon oxide.

Because the first inorganic encapsulation layer 310 is formed along a lower structure, a top surface of the first inorganic encapsulation layer 310 is not flat. The organic encapsulation layer 320 may cover the first inorganic encapsulation layer 310, to substantially planarize the first inorganic encapsulation layer 310. The organic encapsulation layer 320 may include at least one material selected from the group consisting of polyethylene terephthalate, polyethylene naphthalate, polycarbonate, polyimide, polyethylene sulfonate, polyoxymethylene, polyarylate, hexamethyldisiloxane, and acrylic resin (e.g., polymethyl methacrylate or polyacrylic acid).

The second inorganic encapsulation layer 330 may cover the organic encapsulation layer 320, and may include silicon nitride, silicon oxynitride, or silicon oxide.

Even when cracks occur in the thin-film encapsulation layer 300, the cracks may not be connected between the first inorganic encapsulation layer 310 and the organic encapsulation layer 320 or between the organic encapsulation layer 320 and the second inorganic encapsulation layer 330 due to the multi-layer structure. Accordingly, the formation of a path through which external moisture or oxygen penetrates into the display area may be prevented, reduced, or minimized.

The wavelength adjusting layer 400 may be located on the thin-film encapsulation layer 300. The wavelength adjusting layer 400 may include the first and second color conversion layers QD1 and QD2, the transmissive layer TL, and the partition wall 410.

Each of the first and second color conversion layers QD1 and QD2 may include quantum dots. The quantum dots may exhibit unique excitation and emission characteristics according to materials and sizes, and thus may convert incident light into certain color light. Various materials may be used as the quantum dots.

According to some embodiments, a quantum dot may have a core-shell structure including a core including a nanocrystal and a shell surrounding the core. The core of the quantum dot may be selected from among a group II-VI compound, a group III-V compound, a group III-VI semiconductor compound, a group semiconductor compound, a group IV-VI compound, an IV element, an IV compound, and a combination thereof.

The group II-VI compound may be selected from among a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

Examples of the group III-VI semiconductor compound may include a binary compound such as In2S3; a ternary compound such as AgInS, AgInS2, CuInS, or CuInS2; and any combination thereof.

The group III-V compound may be selected from among a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlP, InAlPAs, InAlPSb, and a mixture thereof.

The group III-V semiconductor compound may further include a group II element. Examples of the group III-V semiconductor compound further including the group II element may include InZnP, InGaZnP, and InAlZnP.

Examples of the group III-VI semiconductor compound may include a binary compound such as GaS, GaSe, Ga2Se3, GaTe, InS, InSe, In2Se3, or InTe; a ternary compound such as InGaS3 or InGaSe3; and any combination thereof.

Examples of the group semiconductor compound may include a ternary compound such as AgInS, AgInS2, CuInS, CuInS2, CuGaO2, AgGaO2, or AgAlO2; and any combination thereof.

The group IV-VI compound may be selected from among a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of silicon (Si), germanium (Ge), and a mixture thereof. The group IV compound may be a binary compound selected from the group consisting of SiC, SiGe, and a mixture thereof.

In this case, the binary compound, the ternary compound, or the quaternary compound may exist in particles at a uniform concentration, or may exist in the same particle divided into two states where concentration distributions are partially different. Also, the quantum dot may have a core/shell structure in which one quantum dot surrounds another quantum dot. An interface between the core and the shell may have a concentration gradient in which a concentration of an element in the shell gradually decreases toward the center.

The shell of the quantum dot may function as a protective layer for maintaining semiconductor characteristics by preventing or reducing chemical denaturation of the core and/or a charging layer for giving electrophoretic characteristics to the quantum dot. The shell may have a single or multi-layer structure. An interface between the core and the shell may have a concentration gradient in which a concentration of an element in the shell gradually decreases toward the center.

Examples of the shell of the quantum dot may include an oxide of a metal or a non-metal, a semiconductor compound, and a combination thereof.

Examples of the oxide of the metal or the non-metal may include, but are not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a ternary compound such as $MgAl_2O_4$, $CoFe_2O_4$, $NiFe_2O_4$, or $CoMn_2O_4$.

Examples of the semiconductor compound may include a group III-VI semiconductor compound; a group II-VI semiconductor compound; a group III-V semiconductor compound; a group III-VI semiconductor compound; a group I-III-VI semiconductor compound; and a group IV-VI semiconductor compound, and any combination thereof, as described above. Examples of the semiconductor compound may include, but are not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

A quantum dot may have a full width at half maximum (FWHM) of an emission wavelength spectrum of about 45 nm or less, or according to some embodiments, about 40 nm or less, and according to some embodiments about 30 nm or less. In this range, color purity or color reproducibility may be improved. Also, because light emitted through the quantum dot is emitted in all directions, an optical viewing angle may be improved.

Also, a quantum dot has a shape that is generally used in the art and is not specifically limited. For example, a quantum dot may have a spherical shape, a pyramidal shape, a multi-arm shape, a cubic nanoparticle shape, a nanotube shape, a nanowire shape, a nanofiber shape, or a nanoplate particle shape.

A color of light emitted from the quantum dot may be controlled according to a particle size, and thus the quantum dot may have any of various emission colors such as blue, red, or green.

A diameter of a core of a quantum dot may range from about 2 nm to about 10 nm, and when the quantum dot is exposed to light, the quantum dot may emit light of a specific frequency according to a particle size and a type of a material. An average size of quantum dots included in the first color conversion layer QD1 and an average size of quantum dots included in the second color conversion layer QD2 may be different from each other. For example, larger quantum dots may emit longer wavelengths. Accordingly, sizes of quantum dots may be selected according to colors of the first pixel Pr and the second pixel Pg. That is, depending on the desired color of the pixels, the size of corresponding quantum dots may be selected or varied to achieve the desired color.

Each of the first and second color conversion layers QD1 and QD2 may further include, in addition to quantum dots, various materials for mixing and appropriately dispersing the quantum dots. For example, the first and second color conversion layers QD1 and QD2 may further include scattering particles, a solvent, a photoinitiator, a binder polymer, a dispersant, and the like.

The transmissive layer TL, instead of a color conversion layer, may be located in an emission area EA of the third pixel Pb. The transmissive layer TL may be formed of an organic material for emitting light without changing a wavelength of light emitted from the third organic light-emitting diode OLED3 of the third pixel Pb. According to some embodiments, scattering particles for uniform color spreading may be included in the transmissive layer TL. In this case, the scattering particles may have a diameter ranging from about 200 nm to about 400 nm.

According to some embodiments, the first and second organic light-emitting diodes OLED1 and OLED2 may emit light of the same wavelength, and colors of the first pixel Pr and the second pixel Pg may be determined according to a wavelength changed by quantum dots of the first color conversion layer QD1 and quantum dots of the second color conversion layer QD2.

Because a color conversion layer is not provided in the emission area EA of the third pixel Pb, a color of the third pixel Pb may be determined by a color of light emitted by the third organic light-emitting diode OLED3. For example, a color of the first pixel Pr may be red, a color of the second pixel Pg may be green, and a color of the third pixel Pb may be blue.

The partition wall 410 may be located between the first color conversion layer QD1, the second color conversion layer QD2, and the transmissive layer TL to correspond to a non-emission area NEA. For example, the partition wall 410 may be located between the first color conversion layer QD1 and the second color conversion layer QD2, and between the second color conversion layer QD2 and the transmissive layer TL.

According to some embodiments, the partition wall 410 may include an organic material, and when necessary, the partition wall 410 may include a material for adjusting an optical density such as Cr, CrOx, Cr/CrOx, Cr/CrOx/CrNy, resin (carbon pigment or RGB mixed pigment), graphite, or a non-Cr-based material. Alternatively, the partition wall 410 may include a pigment producing a color such as red, green, or yellow. In this case, the partition wall 410 may function as a black matrix for preventing or reducing color mixing and improving visibility.

In a manufacturing method, the partition wall 410 may be first formed on the thin-film encapsulation layer 300, and then the first color conversion layer QD1, the second color conversion layer QD2, and the transmissive layer TL may be located between the partition walls 410.

A barrier layer 420 may be located on the first color conversion layer QD1, the second color conversion layer QD2, and the transmissive layer TL to planarize and prevent or reduce penetration of impurities. The barrier layer 420 may be formed of silicon nitride, silicon oxynitride, or silicon oxide, and may have a single or multi-layer structure.

The optical functional layer 500 may be located on the wavelength adjusting layer 400. The optical functional layer 500 may include the reflective metal layer 510 and the light-absorbing layer 520 located on the reflective metal layer 510.

The reflective metal layer 510 may include a reflective metal. For example, the reflective metal layer 510 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the reflective metal layer 510 may include a metal having a high reflectance. The reflective metal layer 510 may have a reflectance of about 85% or more, and for example, a reflectance of about 90% or more. The reflectance may be a value measured based on a standard light source D65. The reflective metal layer 510 may include, for example, super aluminum (s-Al). The super aluminum (s-Al) may be an aluminum alloy having high purity, and may have a reflectance of about 89% or more.

As such, because the reflective metal layer 510 includes a reflective metal having a high reflectance, light efficiency of the display apparatus may be improved through light recycling using internal reflection.

The light-absorbing layer 520 may be located on the reflective metal layer 510. The light-absorbing layer 520 may be formed of a metal having an absorption coefficient. For example, the light-absorbing layer 520 may include at least one of molybdenum tantalum oxide (MoTaOx, MTO), molybdenum (Mo), tantalum (Ta), manganese (Mn), or magnesium (Mg). The light-absorbing layer 520 may absorb and block external light, thereby preventing or reducing color mixing between pixels and improving visibility.

Although the optical functional layer 500 has a double-layer structure including the reflective metal layer 510 and the light-absorbing layer 520 in FIG. 5, embodiments according to the present disclosure are not limited thereto.

FIGS. 7 through 10 are cross-sectional views illustrating various examples of the optical functional layer 500 of a display apparatus, according to some embodiments.

According to some embodiments, optical functional layers 500A, 500B, and 500C, and 500D may each further include a phase assistant layer 530. The phase assistant layer 530 may include a light-transmitting metal. The phase assistant layer 530 may include at least one of, for example, indium tin oxide (ITO), indium zinc oxide (IZO), zinc oxide (ZnO), indium oxide ($In_2O_3$), indium gallium oxide (IGO), or aluminum zinc oxide (AZO).

Figure 7:
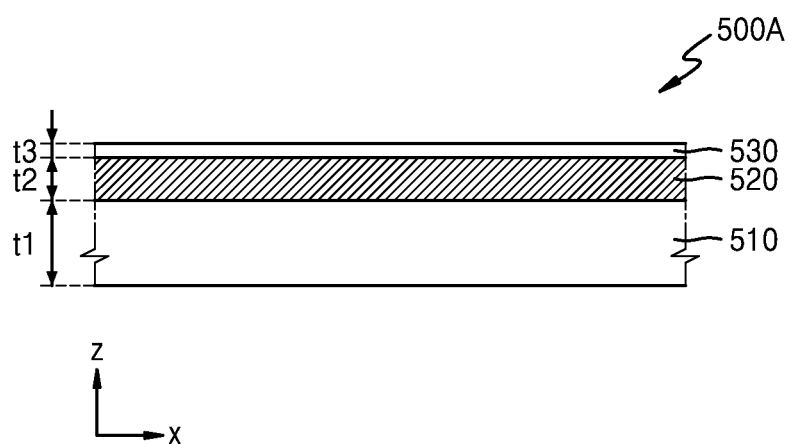
FIGS. 7 through 10 are cross-sectional views illustrating various examples of an optical functional layer of a display apparatus, according to some embodiments.
Figure 8:
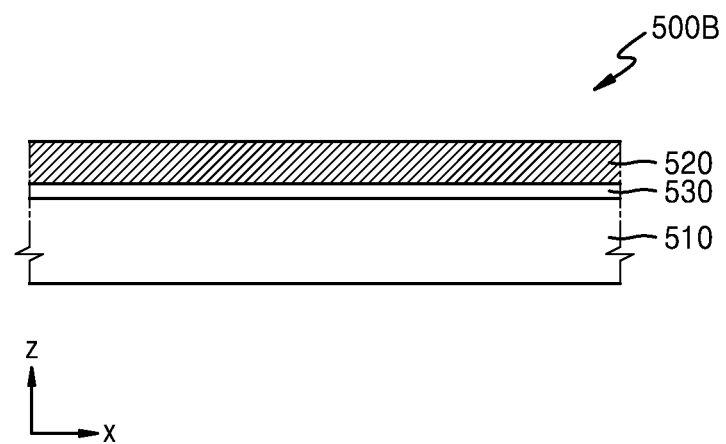
Figure 9:
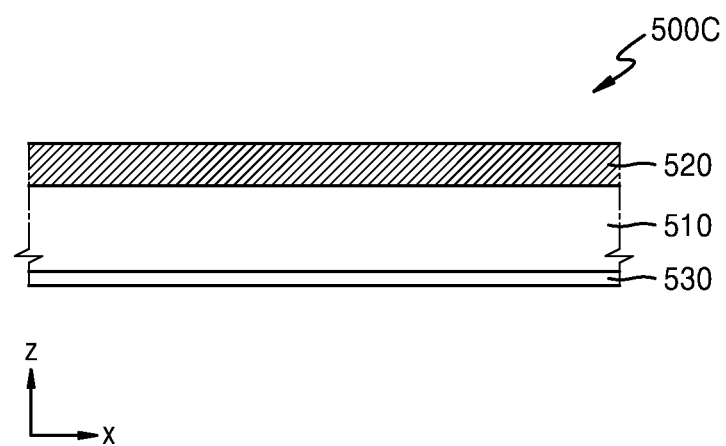
Figure 10:
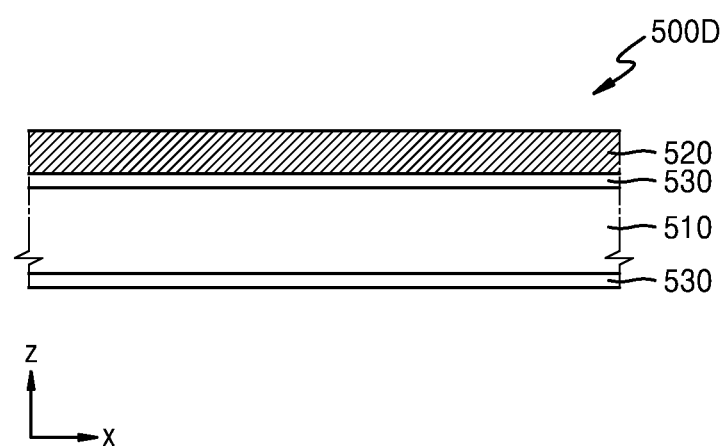

The phase assistant layer 530 may be located on the light-absorbing layer 520 as shown in FIG. 7, or may be located between the reflective metal layer 510 and the light-absorbing layer 520 as shown in FIG. 8, or the phase assistant layer 530 may be arranged and then the reflective metal layer 510 and the light-absorbing layer 520 may be sequentially arranged on the phase assistant layer 530 as shown in FIG. 9. Also, the phase assistant layer 530 may be located under the reflective metal layer 510 and may be located between the reflective metal layer 510 and the light-absorbing layer 520 as shown in FIG. 10. When the phase assistant layer 530 is provided under the reflective metal layer 510 as shown in FIGS. 9 and 10, the phase assistant layer 530 may be provided for adhesion to the barrier layer 420 located under the phase assistant layer 530.

The reflective metal layer 510, the light-absorbing layer 520, and the phase assistant layer 530 included in each of the optical functional layers 500, 500A, 500B, 500C, and 500D of FIGS. 5 and 7 through 10 may be formed to certain thicknesses. From among them, the reflective metal layer 510 may have a greatest thickness, and a thickness of the light-absorbing layer 520 may be less than a thickness of the reflective metal layer 510. When the phase assistant layer 530 is provided, the phase assistant layer 530 may be thinner than the reflective metal layer 510 and the light-absorbing layer 520. According to some embodiments, the reflective metal layer 510 may be formed to a first thickness t1 ranging from about 1000 Å to about 3000 Å, the light-absorbing layer 520 may be formed to a second thickness t2 ranging from about 400 Å to about 1000 Å, and the phase assistant layer 530 may be formed to a third thickness t3 ranging from about 50 Å to about 100 Å.

Referring back to FIG. 5, the optical functional layer 500 may also be located in the non-emission area NEA between the emission areas EA. As described above, because the optical functional layer 500 includes the light-absorbing layer 520, the optical functional layer 500 may function as a black matrix in the non-emission area NEA through the light-absorbing layer 520. Accordingly, because the display apparatus according to some embodiments does not form a separate black matrix, a manufacturing process may be simplified and costs may be reduced.

The optical functional layer 500 may have the plurality of openings OP corresponding to the emission area EA. The plurality of openings OP may pass through the optical functional layer 500. That is, the plurality of openings OP may be formed by passing through the reflective metal layer 510 and the light-absorbing layer 520. According to some embodiments, the plurality of openings OP may be provided to have different aperture ratios according to pixels. The term 'aperture ratio' is distinguished from an absolute emission area or the area of openings, and when the emission area EA defined by an opening of the pixel-defining film 215 is 100, the aperture ratio may refer to a ratio of the area of the plurality of openings OP with respect to the emission area EA.

An aperture ratio of the plurality of openings OP with respect to the emission area EA may be equal to or greater than, for example, about 40%, 45%, or 50%. The aperture ratio may vary according to a condition required for each pixel.

Light emitted by the first through third organic light-emitting diodes OLED1, OLED2, and OLED3 may be finally emitted through the plurality of openings OP to the outside. In this case, as an aperture ratio of the plurality of openings OP increases, light efficiency may be improved but vulnerability to reflection of external light may increase. In contrast, as an aperture ratio of the plurality of openings OP decreases, vulnerability to reflection of externa light may decrease but the amount of blocked light may increase and thus light efficiency may be reduced.

Accordingly, the display apparatus according to some embodiments may optimize an aperture ratio by adjusting a size of the plurality of openings OP of the optical functional layer 500, and may improve light efficiency by locating the reflective metal layer 510 on a surface of the optical functional layer 500 to cause some light not passing through the plurality of openings OP to be reflected by the reflective metal layer 510 and reproduced.

A filter layer 600 may be located on the optical functional layer 500. The filter layer 600 may be located to correspond to only the first pixel Pr and the second pixel Pb. The filter layer 600 may include a yellow organic film.

In the first pixel Pr and the second pixel Pb, a wavelength of light emitted by the first organic light-emitting diode OLED1 and the second organic light-emitting diode OLED2 may be changed while passing through the first color conversion layer QD1 and the second color conversion layer QD2, and thus a color of light emitted by the first organic light-emitting diode OLED1 and the second organic light-emitting diode OLED2 may be different from a color of light emitted by the first pixel Pr and the second pixel Pb. When a wavelength of light is changed by the first color conversion layer QD1 and the second color conversion layer QD2, some light passes through the first color conversion layer QD1 and the second color conversion layer QD2 as it is without changing a wavelength. The filter layer 600 may transmit only light of a desired wavelength by blocking or absorbing the some light (noise light) passing through the first color conversion layer QD1 and the second color conversion layer QD2 without changing a wavelength. Accordingly, the filter layer 600 may prevent or reduce color light to be emitted by first pixel Pr and the second pixel Pb from being mixed with different color light, thereby realizing a full-color image, improving color purity, and improving outdoor visibility.

Referring to FIG. 6, an overcoat layer 700 may be located on the filter layer 600. The overcoat layer 700 may be formed of a light-transmitting material, and may planarize a stepped portion formed by the optical functional layer 500 and the filter layer 600. In some embodiments, the overcoat layer 700 may be omitted.

A low reflection film 800 may be located on the overcoat layer 700. The low reflection film 800 may reduce reflection of external light. The low reflection film 800 may be formed to a thickness ranging from about 0.1 μm to about 0.2 μm. In some embodiments, the low reflection film 800 may be omitted.

Figure 11:
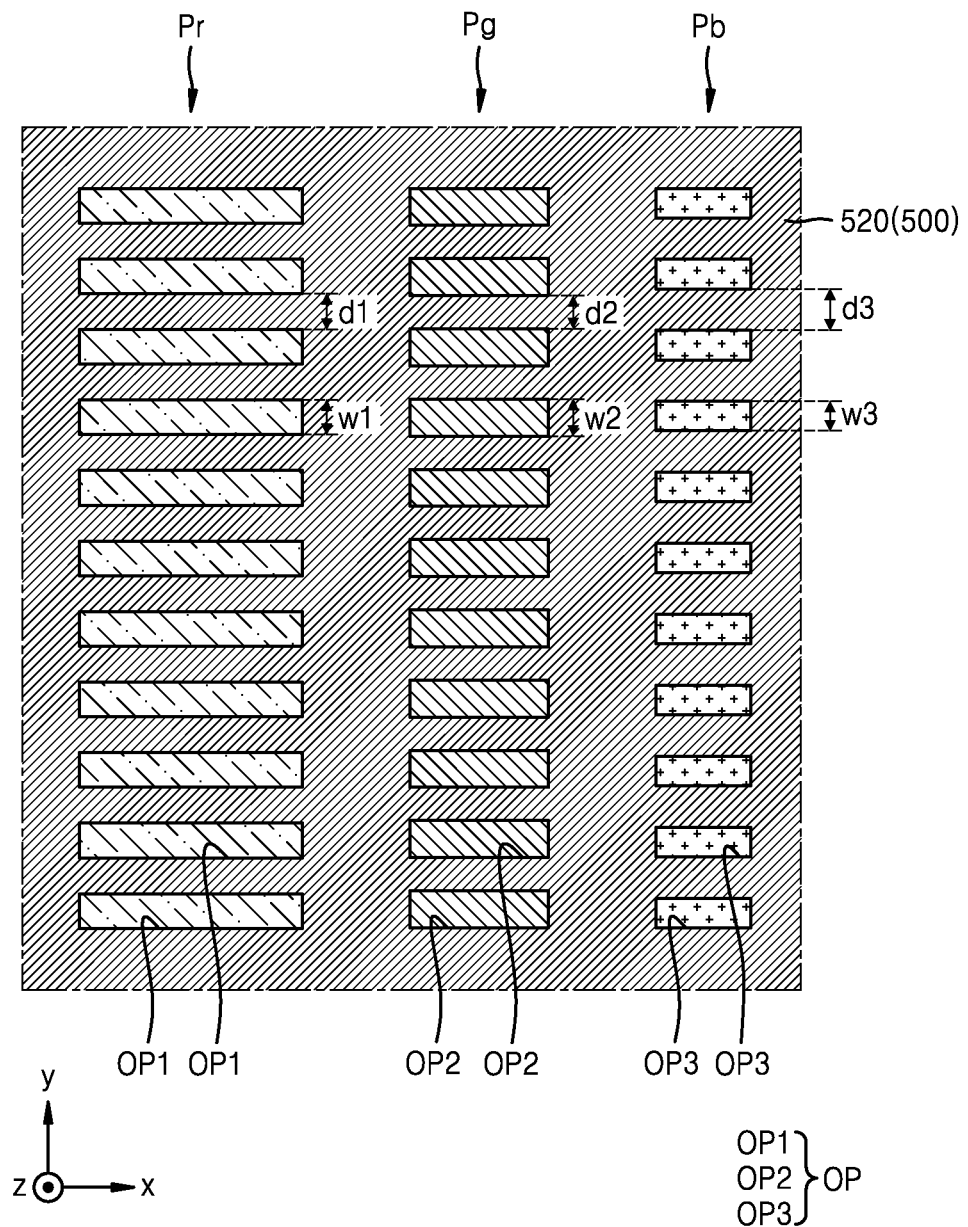
FIG. 11 is a plan view illustrating pixels that may be included in a display apparatus, according to some embodiments.

FIG. 11 is a plan view illustrating pixels that may be included in a display apparatus, according to some embodiments.

Referring to FIG. 11, the first through third pixels Pr, Pg, and Pb may be spaced apart from one another but may be adjacent to one another. Each of the first through third pixels Pr, Pg, and Pb may refer to a sub-pixel. Although the first through third pixels Pr, Pg, and Pb are arranged in a stripe shape in FIG. 11, the first through third pixels Pr, Pg, and Pb may be arranged in a pentile shape, a diamond shape, or the like.

According to some embodiments, the first through third pixels Pr, Pg, and Pb may respectively emit red light, green light, and blue light. The first through third pixels Pr, Pg, and Pb may have different emission area due to a visibility difference of emitted color light. For example, although an emission area of the first pixel Pr that emits red light is the greatest and an emission area of the third pixel Pb that emits blue light is the smallest in FIG. 11, the disclosure is not limited thereto.

As described above, the optical functional layer 500 may have the plurality of openings OP corresponding to the first through third emission areas Pr-EA, Pg-EA, and Pb-EA of the first through third pixels Pr, Pg, and Pb. The plurality of openings OP may include the first openings OP1 corresponding to the first emission area Pr-EA of the first pixel Pr, the second openings OP2 corresponding to the second emission area Pg-EA, and the third openings OP3 corresponding to the third emission area Pb-EA of the third pixel Pb. The first through third openings OP1, OP2, and OP3 may be formed as, for example, slits. Although the plurality of openings OP each have a rectangular shapes and are continuously arranged in one direction in FIG. 11, each of the plurality of openings OP may have any of various shapes such as a circular shape, an elliptical shape, or a polygonal shape.

According to some embodiments, the first through third openings OP1, OP2, and OP3 may have different aperture ratios for the respective first through third pixels Pr, Pg, and Pb. That is, a first width w1 of the first openings OP1, a second width w2 of the second openings OP2, and a third width w3 of the third openings OP3 may be different from one another. In FIG. 11, the first through third widths w1, w2, and w3 of the first through third openings OP1, OP2, and OP3 may refer to widths in a y-direction.

Also, a first interval d1 between the first openings OP1, a second interval d2 between the second openings OP2, and a third interval d3 between the third openings OP3 may be different from one another. For example, as shown in FIG. 11, the third width w3 of the third openings OP3 of the third pixel Pb that emits blue light may be the smallest, and the second width w2 of the second openings OP2 of the second pixel Pg that emits green light may be the greatest. Also, the third interval d3 between the third openings OP3 of the third pixel Pb may be the greatest, and the second interval d2 between the second openings OP2 of the second pixel Pg that emits green light may be the smallest. Accordingly, an aperture ratio of the third pixel Pb may be the smallest, and an aperture ratio of the second pixel Pg may be the greatest. As such, light efficiency, a reflectance, a reflected color, etc. of each pixel may be relatively easily controlled, by adjusting an aperture ratio for each of the first through third pixels Pr, Pg, and Pb.

Figure 12:
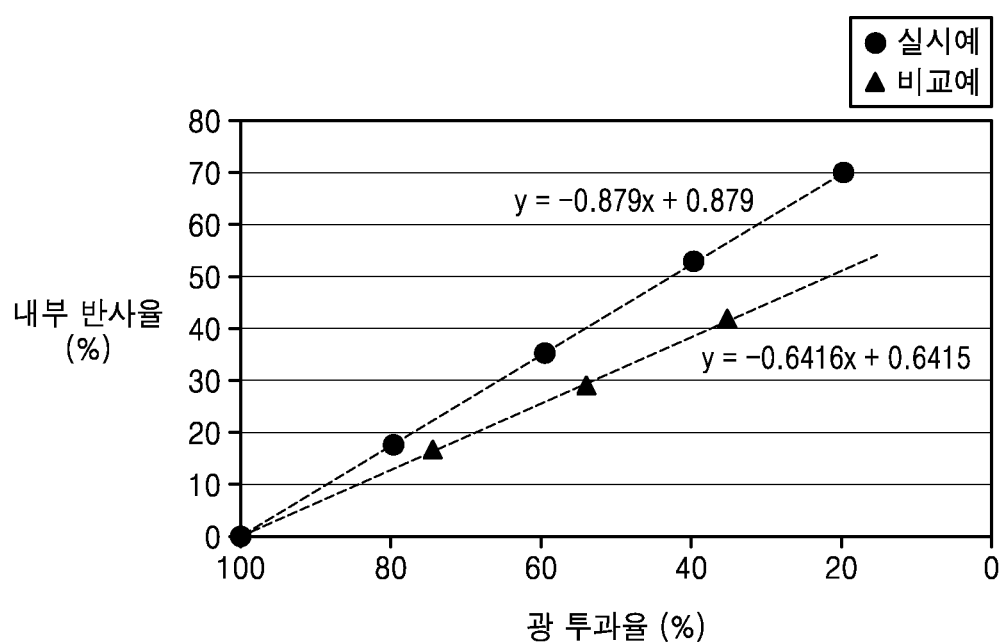
FIG. 12 is a graph illustrating a relationship between an internal reflectance and a transmittance of an optical functional layer of a display apparatus according to some embodiments.
Figure 13:
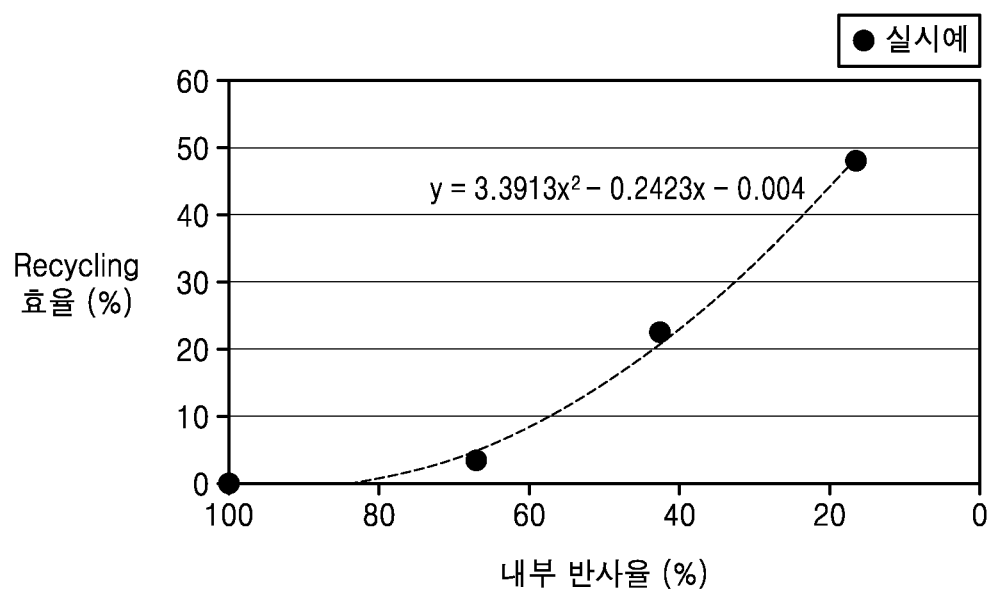
FIG. 13 is a graph illustrating a relationship between light recycling efficiency and an internal reflectance of the display apparatus according to some embodiments.
Figure 14:
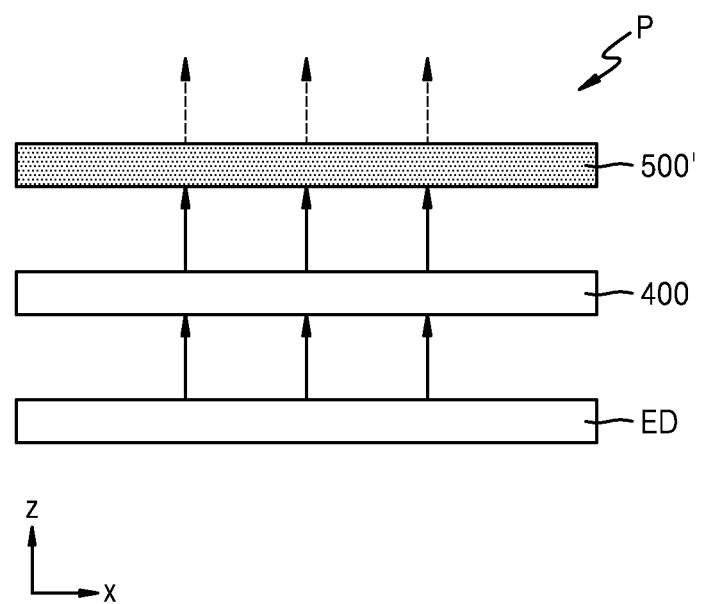
FIG. 14 is a view illustrating a display apparatus according to a comparative example of FIG. 12.

FIG. 12 is a graph illustrating a relationship between an internal reflectance and a transmittance of an optical functional layer of a display apparatus according to some embodiments. FIG. 13 is a graph illustrating a relationship between light recycling efficiency and an internal reflectance of the display apparatus according to some embodiments. FIG. 14 is a view illustrating a display apparatus according to a comparative example of FIG. 12.

In the comparative example of FIG. 12, an optical functional layer 500' includes a transflective metal layer as described below with reference to FIG. 14. In the display apparatus according to some embodiments, in the optical functional layer 500, light is blocked by the light-absorbing layer 520 and internal light may be transmitted to the outside by the plurality of openings OP. In contrast, because the optical functional layer 500' of FIG. 14 does not have a plurality of openings and is transflective, part of light emitted by the light-emitting device ED and passing through the wavelength adjusting layer 400 may pass through the optical functional layer 500' itself and may be transmitted to the outside.

Referring to FIG. 12, it is found that a transmittance and an internal reflectance are directly proportional to each other. An absolute value of a gradient of an internal reflectance with respect to a transmittance of the optical functional layer 500' of the comparative example is 0.6416, whereas an absolute value of a gradient of an internal reflectance with respect to a transmittance of the optical functional layer 500 of the embodiment is 0.879. That is, it is found that, when the optical functional layer 500 of the embodiment and the optical functional layer 500' of the comparative example have the same transmittance, an internal reflectance of the display apparatus of the embodiment is higher than an internal reflectance of the display apparatus of the comparative example, and as the transmittance of the optical functional layer 500 of the embodiment and the optical functional layer 500' of the comparative example decreases, an internal reflectance difference gradually increases.

As such, when an internal reflectance is high, it may mean that light recycling efficiency using internal reflection is high.

Referring to FIG. 13, according to some embodiments, it is found that light recycling efficiency using an internal reflectance quadratically increases. Referring to the graph of FIG. 12, it may be inferred that the display apparatus according to the embodiments having a higher internal reflectance with respect to the same transmittance will have much higher light recycling efficiency than that of the display apparatus according to the comparative example.

As a result, it is found that, when the optical functional layer 500 of the embodiment and the optical functional layer 500' of the comparative example have the same transmittance, light efficiency of the display apparatus according to some embodiments is much higher. Accordingly, the display apparatus according to some embodiments may improve light efficiency through light recycling using internal reflection and may block reflection of external light.

Although only the display apparatus 1 has been mainly described, the present disclosure is not limited thereto. For example, a method of manufacturing the display apparatus may also be within the scope of the disclosure.

FIGS. 15A through 15E are cross-sectional views illustrating a method of manufacturing a display apparatus, according to some embodiments.

Figure 15D:
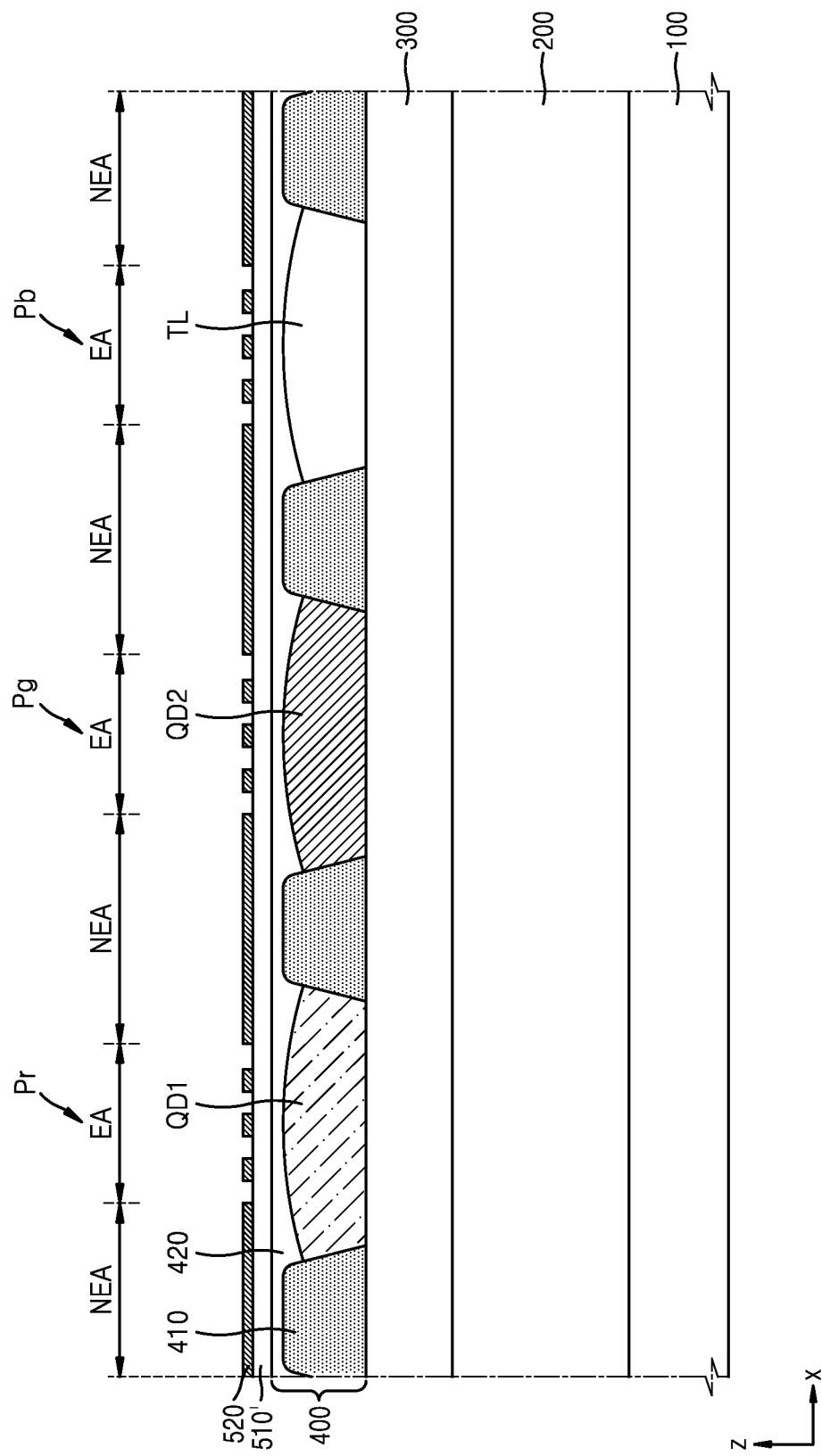

First, referring to FIG. 15A, the display layer 200 may be formed on the substrate 100, and the thin-film encapsulation layer 300 may be formed on the display layer 200. The display layer 200 and the thin-film encapsulation layer 300 may be sequentially formed on the substrate 100 through deposition and patterning processes according to a stacking order. Although the display layer 200 and the thin-film encapsulation layer 300 are simply illustrated for convenience of description in FIGS. 15A through 15E, the display layer 200 and the thin-film encapsulation layer 300 may have a structure of FIG. 5. Configurations of the display layer 200 and the thin-film encapsulation layer 300 have been described according to an order in which the display layer 200 and the thin-film encapsulation layer 300 are stacked on the substrate 100 in FIG. 5, and thus a repeated description thereof will be omitted.

The partition wall 410 may be formed on the thin-film encapsulation layer 300. The partition wall 410 may be formed to correspond to the non-emission area NEA, and may be patterned to have an opening 4100P corresponding to the emission area EA.

Referring to FIG. 15B, the first color conversion layer QD1, the second color conversion layer QD2, and the transmissive layer TL may be formed between the partition walls 410. Each of the first color conversion layer QD1, the second color conversion layer QD2, and the transmissive layer TL may be located in the opening 4100P formed in the partition wall 410. As described above with reference to FIG. 5, the first color conversion layer QD1 may be formed to correspond to the first pixel Pr, the second color conversion layer QD2 may be formed to correspond to the second pixel Pg, and the transmissive layer TL may be formed to correspond to the third pixel Pb. The first color conversion layer QD1, the second color conversion layer QD2, and the transmissive layer TL may be formed by using, for example, inkjet printing.

Referring to FIG. 15C, the barrier layer 420 may be located on the first color conversion layer QD1, the second color conversion layer QD2, and the transmissive layer TL. A reflective metal material layer 510' and a light-absorbing material layer 520' may be sequentially formed on the barrier layer 420.

According to some embodiments, the reflective metal material layer 510' may include a reflective metal. The reflective metal material layer 510' may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the reflective metal layer 510 may include a metal having a high reflectance, and the reflective metal material layer 510' may have a reflectance of about 85% or more, and for example, a reflectance of about 90% or more. The reflective metal material layer 510' may include, for example, super aluminum (s-Al). The super aluminum (s-Al) may be an aluminum alloy having high purity, and may have a reflectance of about 89% or more.

According to some embodiments, the light-absorbing material layer 520' may include an organic black matrix. The light-absorbing material layer 520' may be a member for improving color vividness and contrast. The light-absorbing material layer 520' may include at least one of a black pigment, a black dye, or black particles in an organic material. In some embodiments, the light-absorbing material layer 520' may include Cr, CrOx, Cr/CrOx, Cr/CrOx/CrNy, resin (carbon pigment or RGB mixed pigment), graphite, or a non-Cr-based material.

Referring to FIG. 15D, the light-absorbing layer 520 may be formed by patterning the light-absorbing material layer 520'. According to some embodiments, a pattern may be formed by using a photoresist on the light-absorbing material layer 520', a pattern may be formed by etching the light-absorbing material layer 520' by using a photoresist pattern, and then the photoresist may be removed.

Figure 15E:
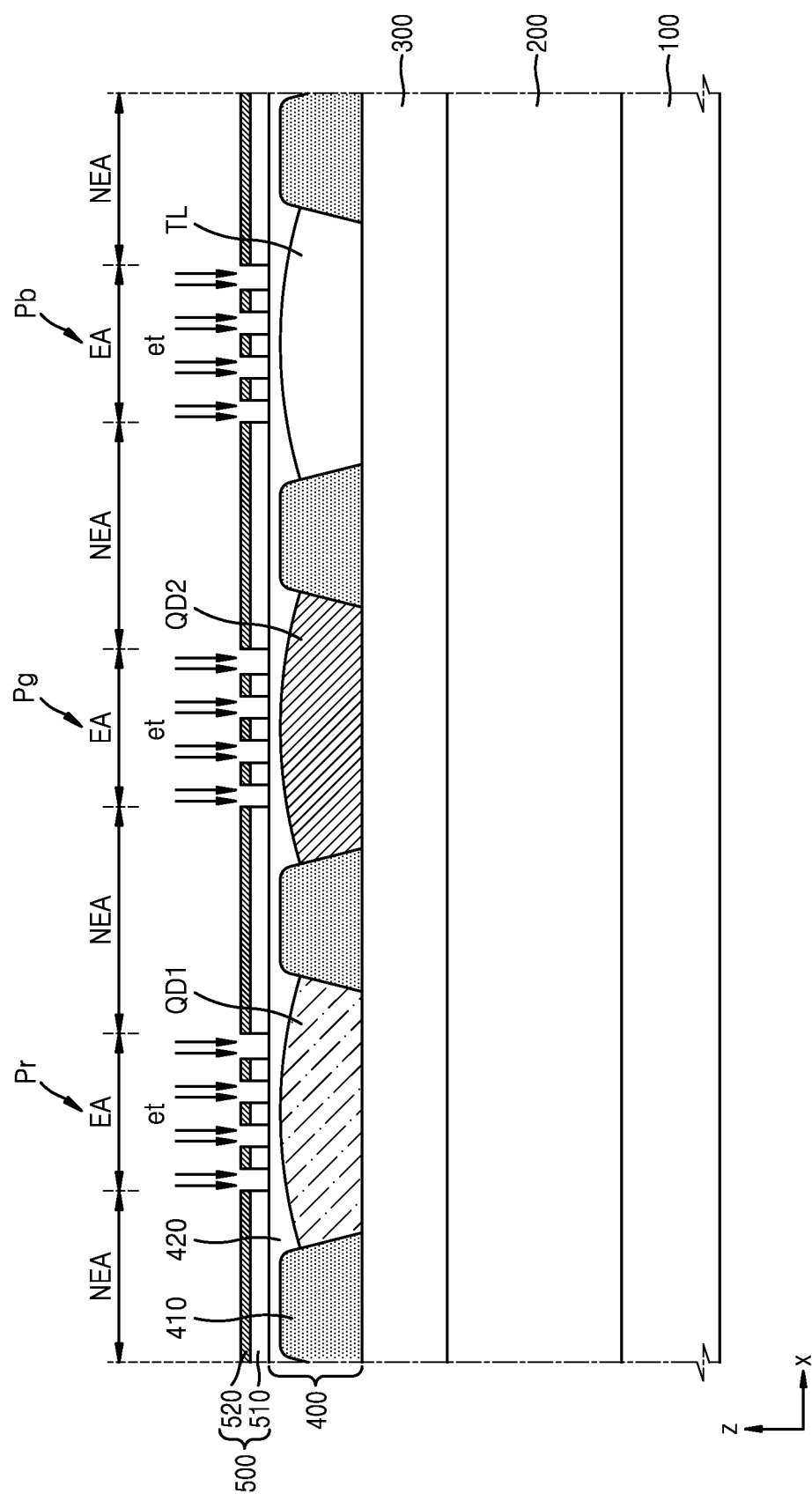

Next, referring to FIG. 15E, an etching process et of forming the reflective metal layer 510 may be performed by patterning the reflective metal material layer 510' using the patterned light-absorbing layer 520 as a mask pattern. As described above, because the light-absorbing layer 520 includes an organic material and the reflective metal layer 510 includes a metal material, separate etching processes should be performed to pattern the light-absorbing layer 520 and the reflective metal layer 510, thereby increasing the number of masks and adding a process.

Accordingly, in the display apparatus according to some embodiments, because the reflective metal material layer 510' is patterned by using the patterned light-absorbing layer 520 as a mask pattern without performing a separate mask process for patterning the reflective metal layer 510, the optical functional layer 500 may be relatively easily manufactured without adding a manufacturing process for forming the reflective metal layer 510.

Because the reflective metal layer 510 according to the present embodiment includes a reflective metal having a high reflectance, light efficiency of the display apparatus may be improved through light recycling using internal reflection.

As described above, according to the one or more embodiments, a display apparatus with relatively minimized or reduce reflection of external light and relatively improved light efficiency and a method of manufacturing the display apparatus may be provided. However, embodiments according to the disclosure are not limited by these characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:
    a first light-emitting device, a second light-emitting device, and a third light-emitting device, on a substrate;
    a first color conversion layer and a second color conversion layer respectively on the first light-emitting device and the second light-emitting device;
    a transmissive layer on the third light-emitting device; and
    an optical functional layer on the first color conversion layer, the second color conversion layer, and the transmissive layer, and comprising a reflective metal layer and a light-absorbing layer, the light-absorbing layer being on the reflective metal layer,
    wherein the optical functional layer comprises a plurality of openings respectively corresponding to a first emission area of the first light-emitting device, a second emission area of the second light-emitting device, and a third emission area of the third light-emitting device.

2. The display apparatus of claim 1, wherein the plurality of openings are formed as slits.

3. The display apparatus of claim 1, wherein a reflectance of the reflective metal layer is equal to or greater than 85%.

4. The display apparatus of claim 2, wherein the reflective metal layer comprises a super aluminum (s-Al) metal.

5. The display apparatus of claim 1, wherein the light-absorbing layer comprises a metal having an absorption coefficient.

6. The display apparatus of claim 5, wherein the light-absorbing layer comprises at least one of molybdenum (Mo), tantalum (Ta), manganese (Mn), or magnesium (Mg).

7. The display apparatus of claim 5, wherein the light-absorbing layer comprises molybdenum tantalum oxide (MoTaOx, MTO).

8. The display apparatus of claim 1, wherein the light-absorbing layer comprises an organic black matrix.

9. The display apparatus of claim 1, wherein the reflective metal layer has a thickness ranging from 1000 Å to 3000 Å.

10. The display apparatus of claim 1, wherein the light-absorbing layer has a thickness ranging from 400 Å to 1000 Å.

11. The display apparatus of claim 1, wherein the optical functional layer further comprises a phase assistant layer on the reflective metal layer.

12. The display apparatus of claim 11, wherein the phase assistant layer is between the reflective metal layer and the light-absorbing layer, or on the light-absorbing layer.

13. The display apparatus of claim 11, wherein the phase assistant layer comprises a light-transmitting metal.

14. The display apparatus of claim 11, wherein the phase assistant layer has a thickness ranging from 50 Å to 100 Å.

15. The display apparatus of claim 1, wherein the plurality of openings comprise first openings located in the first emission area, second openings located in the second emission area, and third openings located in the third emission area,
    wherein the first openings, the second openings, and the third openings have different aperture ratios.

16. The display apparatus of claim 15, wherein widths of the first openings, the second openings, and the third openings are different from one another.

17. The display apparatus of claim 1, wherein the first color conversion layer comprises first quantum dots, and the second color conversion layer comprises second quantum dots.

18. The display apparatus of claim 1, further comprising a filter layer on the optical functional layer corresponding to the first color conversion layer and the second color conversion layer.

19. The display apparatus of claim 18, wherein the filter layer comprises a yellow organic material.

20. The display apparatus of claim 1, wherein each of the first light-emitting device, the second light-emitting device, and the third light-emitting device is an organic light-emitting diode that emits blue light.

21. A method of manufacturing a display apparatus, the method comprising:
    forming, on a substrate, a first light-emitting device, a second light-emitting device, and a third light-emitting device;
    forming a first color conversion layer, a second color conversion layer, and a transmissive layer respectively on the first light-emitting device, the second light-emitting device, and the third light-emitting device;
    forming a reflective metal material layer on the first color conversion layer, the second color conversion layer, and the transmissive layer;
    forming a light-absorbing material layer on the reflective metal material layer;
    forming a light-absorbing layer by patterning the light-absorbing material layer to have a plurality of openings respectively corresponding to the first light-emitting device, the second light-emitting device, and the third light-emitting device; and
    forming a reflective metal layer by patterning the reflective metal material layer by using the light-absorbing layer as a mask pattern.

22. The method of claim 21, wherein the light-absorbing layer comprises an organic black matrix.

23. The method of claim 21, wherein aperture ratios of the plurality of openings respectively corresponding to the first light-emitting device, the second light-emitting device, and the third light-emitting device are different from one another.

* * * * *